(12) United States Patent
Lin et al.

(10) Patent No.: US 11,488,838 B2
(45) Date of Patent: Nov. 1, 2022

(54) SEMICONDUCTOR DEVICE HAVING AN EMBEDDED CONDUCTIVE LAYER FOR POWER/GROUND PLANES IN FO-EWLB

(71) Applicant: STATS ChipPAC Pte. Ltd., Singapore (SG)

(72) Inventors: Yaojian Lin, Jiangyin (CN); Xu Sheng Bao, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 16/918,643

(22) Filed: Jul. 1, 2020

(65) Prior Publication Data
US 2020/0335358 A1 Oct. 22, 2020

Related U.S. Application Data

(60) Continuation of application No. 15/605,010, filed on May 25, 2017, now Pat. No. 10,741,416, which is a (Continued)

(51) Int. Cl.
H01L 21/48 (2006.01)
H01L 23/00 (2006.01)
(Continued)

(52) U.S. Cl.
CPC ...... H01L 21/485 (2013.01); H01L 23/49822 (2013.01); H01L 23/49827 (2013.01);
(Continued)

(58) Field of Classification Search
CPC ..... H01L 21/56; H01L 21/485; H01L 21/565; H01L 21/568; H01L 23/49827;
(Continued)

(56) References Cited

U.S. PATENT DOCUMENTS 5,353,498 A 10/1994 Fillion et al.
6,825,553 B2 11/2004 Chua et al.
(Continued)

FOREIGN PATENT DOCUMENTS

CN 102194711 A 9/2011

Primary Examiner — Khiem D Nguyen
(74) Attorney, Agent, or Firm — Brian M. Kaufman; Robert D. Atkins; Patent Law Group: Atkins and Associates, P.C.

(57) ABSTRACT

A semiconductor device has a first conductive layer and a semiconductor die disposed adjacent to the first conductive layer. An encapsulant is deposited over the first conductive layer and semiconductor die. An insulating layer is formed over the encapsulant, semiconductor die, and first conductive layer. A second conductive layer is formed over the insulating layer. A first portion of the first conductive layer is electrically connected to $V_{SS}$ and forms a ground plane. A second portion of the first conductive layer is electrically connected to $V_{DD}$ and forms a power plane. The first conductive layer, insulating layer, and second conductive layer constitute a decoupling capacitor. A microstrip line including a trace of the second conductive layer is formed over the insulating layer and first conductive layer. The first conductive layer is provided on an embedded dummy die, interconnect unit, or modular PCB unit.

25 Claims, 15 Drawing Sheets

Related U.S. Application Data division of application No. 14/193,267, filed on Feb. 28, 2014, now Pat. No. 9,685,350.

(60) Provisional application No. 61/774,692, filed on Mar. 8, 2013.

(51) Int. Cl.
  *H01L 23/498* (2006.01)
  *H01L 23/538* (2006.01)
  *H01L 21/56* (2006.01)

(52) U.S. Cl.
  CPC .... *H01L 23/49833* (2013.01); *H01L 23/5389* (2013.01); *H01L 24/19* (2013.01); *H01L 24/97* (2013.01); *H01L 21/568* (2013.01); *H01L 23/49816* (2013.01); *H01L 2224/04105* (2013.01); *H01L 2224/12105* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/18162* (2013.01)

(58) Field of Classification Search
  CPC ........... H01L 23/49833; H01L 23/5389; H01L 2224/04105; H01L 2224/12105; H01L 24/19; H01L 24/97; H01L 23/49822; H01L 2924/18162; H01L 2924/12042; H01L 2924/181; H01L 2924/01322; H01L 2924/1306; H01L 2924/12041; H01L 2924/13091
  USPC ........................................................ 257/666
  See application file for complete search history.

(56) References Cited

U.S. PATENT DOCUMENTS

| | | | |
|---|---|---|---|
| 6,845,184 B1* | 1/2005 | Yoshimura | G02B 6/12002 385/14 |
| 7,417,299 B2 | 8/2008 | Hu | |
| 7,642,128 B1 | 1/2010 | Lin et al. | |
| 8,097,490 B1 | 1/2012 | Pagaila et al. | |
| 8,269,671 B2* | 9/2012 | Chen | H01Q 21/065 343/700 MS |
| 8,669,646 B2* | 3/2014 | Tabatabai | H01L 23/552 257/659 |
| 8,765,527 B1* | 7/2014 | Koey | H01L 21/568 438/113 |
| 8,922,013 B2 | 12/2014 | Hwang et al. | |
| 8,941,235 B2* | 1/2015 | Pendse | H05K 1/181 257/724 |
| 8,980,696 B2* | 3/2015 | Meng | H01L 23/5389 438/110 |
| 9,406,658 B2* | 8/2016 | Lee | H01L 23/5389 |
| 2003/0077871 A1* | 4/2003 | Cheng | H01L 24/19 438/381 |
| 2004/0043533 A1 | 3/2004 | Chua et al. | |
| 2004/0046250 A1* | 3/2004 | Chua | H01L 23/5389 257/723 |
| 2005/0236709 A1 | 10/2005 | Eng et al. | |
| 2006/0261451 A1 | 11/2006 | Nakatsu et al. | |
| 2007/0152320 A1 | 7/2007 | Yamagata | |
| 2008/0128916 A1* | 6/2008 | Soejima | H01L 23/66 257/E23.126 |
| 2008/0230878 A1* | 9/2008 | Lu | H01L 23/49541 257/667 |
| 2009/0051025 A1* | 2/2009 | Yang | H01L 23/3128 257/690 |
| 2009/0146297 A1 | 6/2009 | Badakere et al. | |
| 2009/0309212 A1 | 12/2009 | Shim et al. | |
| 2010/0047970 A1 | 2/2010 | Eichelberger et al. | |
| 2010/0072618 A1 | 3/2010 | Camacho et al. | |
| 2010/0078760 A1* | 4/2010 | Tang | H01L 23/5389 257/531 |
| 2010/0127396 A1* | 5/2010 | Tang | H01L 23/50 257/773 |
| 2010/0140779 A1* | 6/2010 | Lin | H01L 23/49827 257/690 |
| 2010/0207258 A1 | 8/2010 | Eun et al. | |
| 2010/0237477 A1 | 9/2010 | Pagaila et al. | |
| 2010/0252919 A1* | 10/2010 | Xu | H01L 23/49822 257/686 |
| 2010/0264533 A1 | 10/2010 | Chen | |
| 2010/0267207 A1 | 10/2010 | Tang | |
| 2011/0037155 A1* | 2/2011 | Pagaila | H01L 23/36 257/686 |
| 2011/0049687 A1 | 3/2011 | Kuan et al. | |
| 2011/0062549 A1 | 3/2011 | Lin | |
| 2011/0156237 A1 | 6/2011 | Gulpen et al. | |
| 2011/0204509 A1 | 8/2011 | Lin et al. | |
| 2011/0241222 A1* | 10/2011 | Sezi | H01L 24/19 257/E23.116 |
| 2011/0291249 A1 | 12/2011 | Chi et al. | |
| 2012/0056312 A1 | 3/2012 | Pagaila et al. | |
| 2012/0074592 A1* | 3/2012 | Luan | H01L 24/97 257/777 |
| 2012/0104601 A1 | 5/2012 | Badakere et al. | |
| 2012/0133032 A1* | 5/2012 | Tsai | H01L 21/561 257/659 |
| 2012/0175769 A1 | 7/2012 | Pendse | |
| 2012/0329212 A1 | 12/2012 | Leal | |
| 2013/0075936 A1* | 3/2013 | Lin | H01L 23/49816 257/777 |
| 2013/0221452 A1 | 8/2013 | Strothmann et al. | |
| 2013/0280826 A1* | 10/2013 | Scanlan | H01L 24/03 438/15 |
| 2013/0292852 A1* | 11/2013 | Fuergut | H01L 24/96 257/777 |
| 2013/0320530 A1 | 12/2013 | Koey et al. | |
| 2013/0334712 A1* | 12/2013 | Meyer-Berg | H01L 21/561 438/107 |
| 2014/0091442 A1* | 4/2014 | Cheah | H01L 21/561 257/E23.033 |
| 2014/0110840 A1 | 4/2014 | Wojnowski et al. | |

* cited by examiner

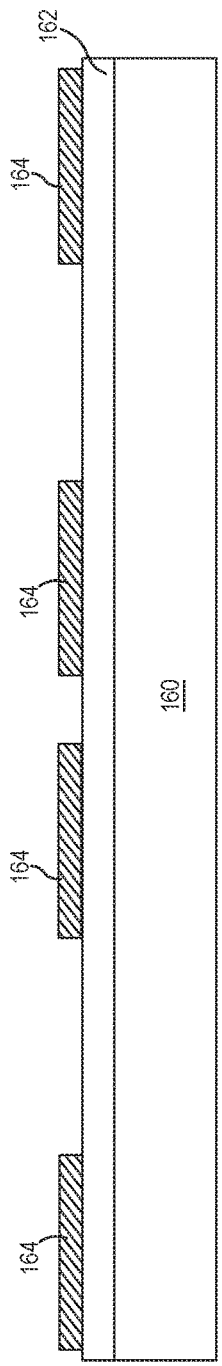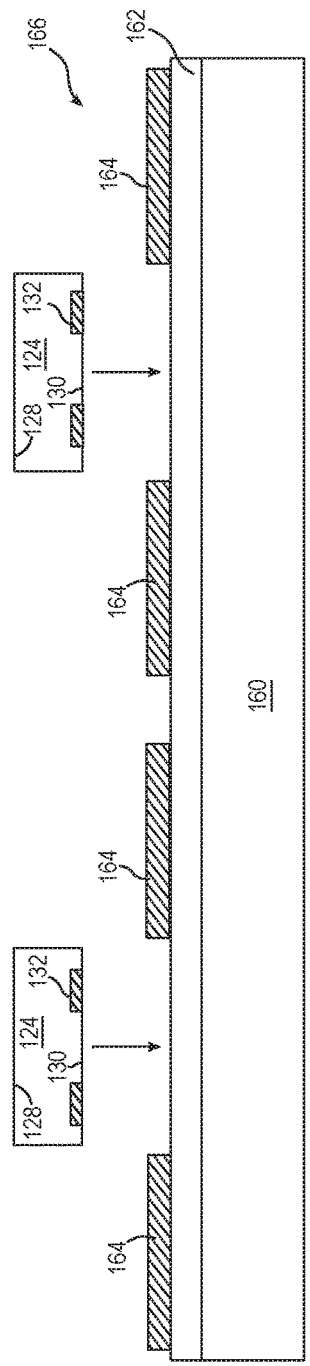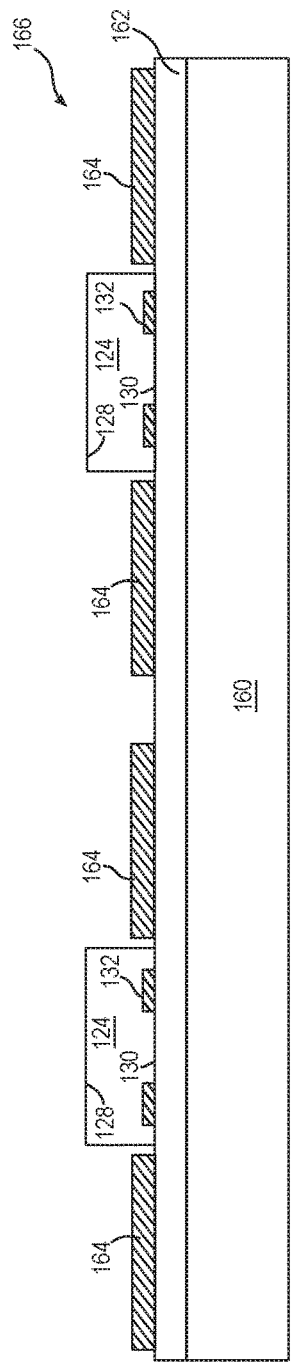

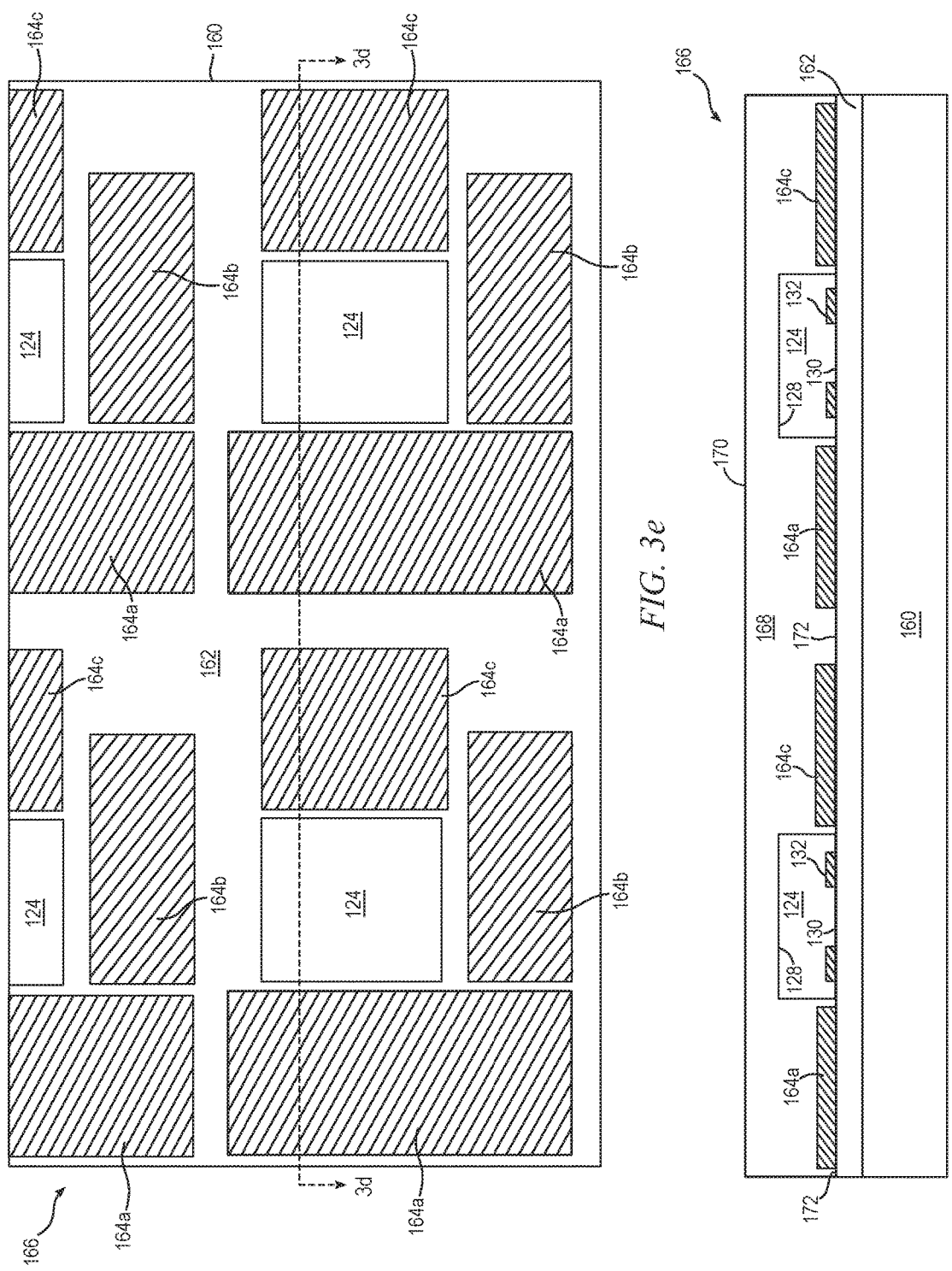

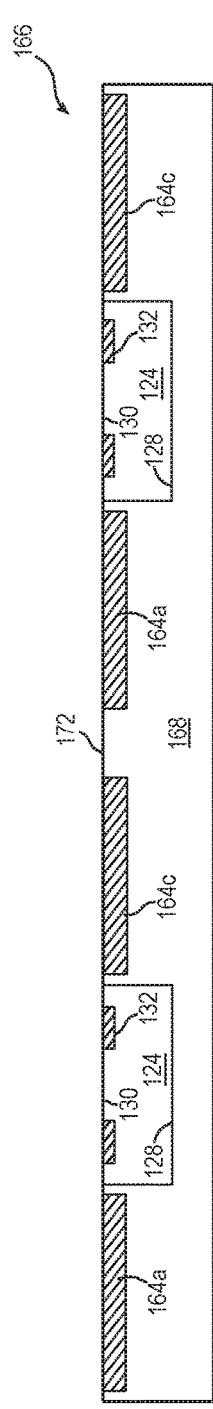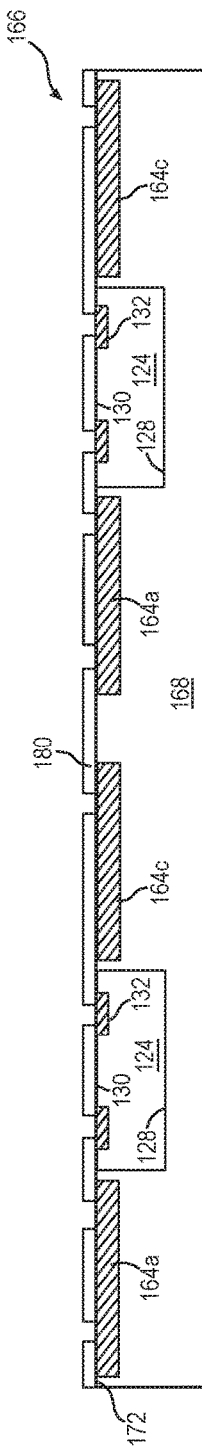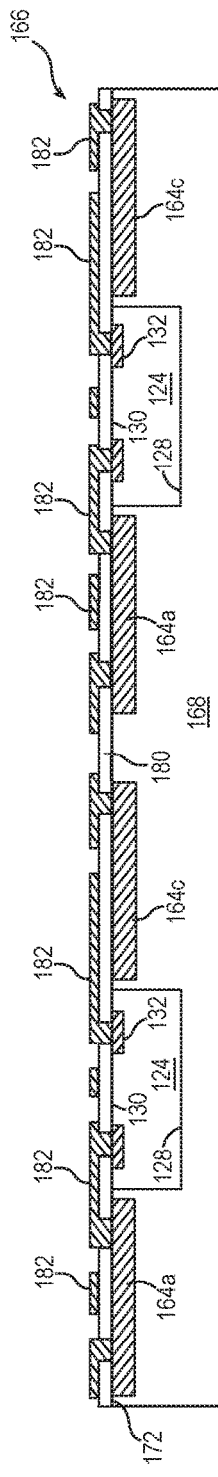

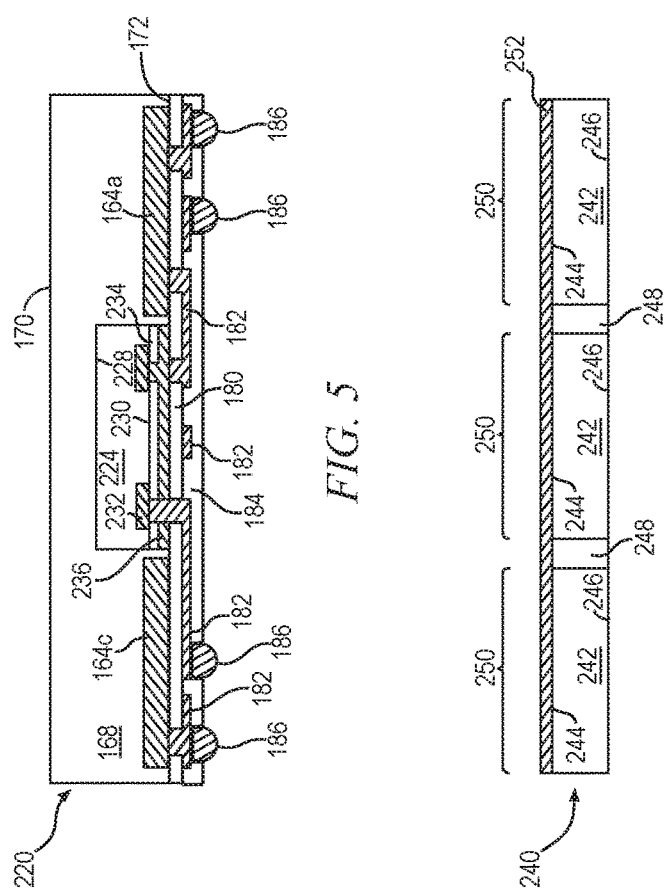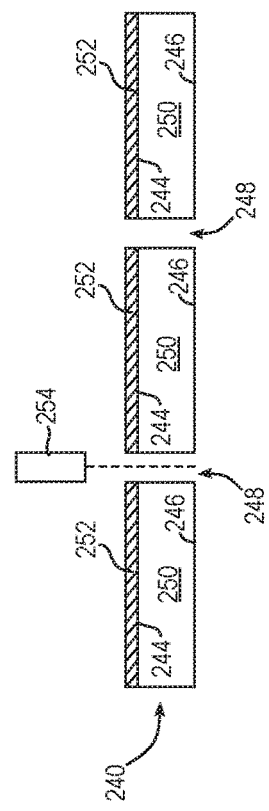

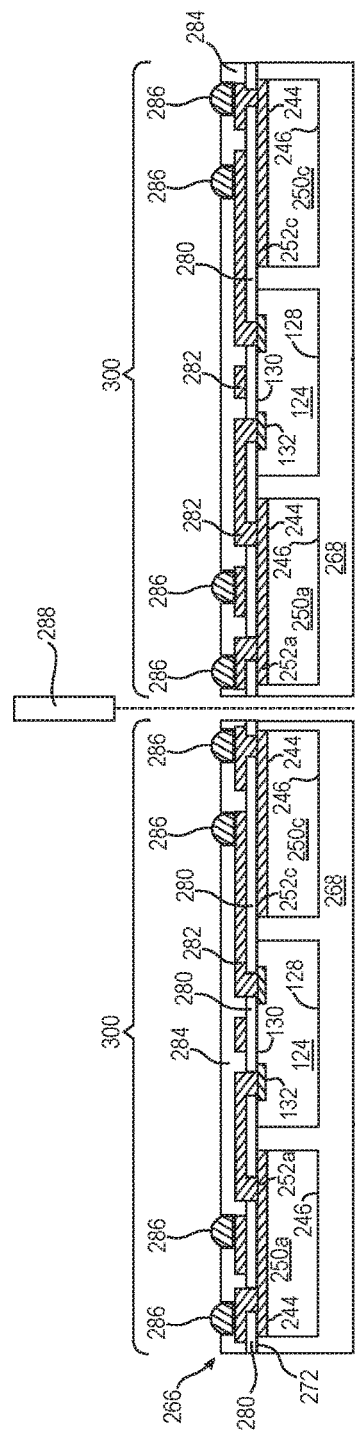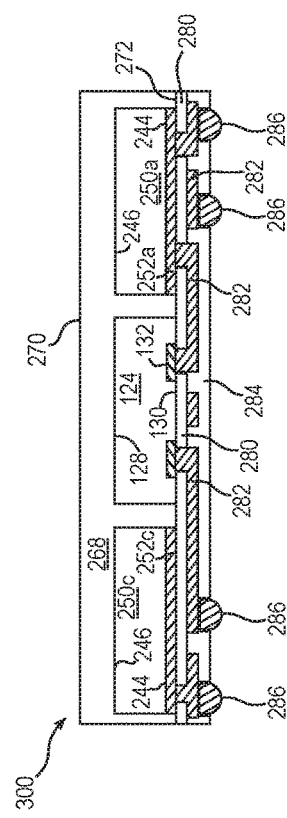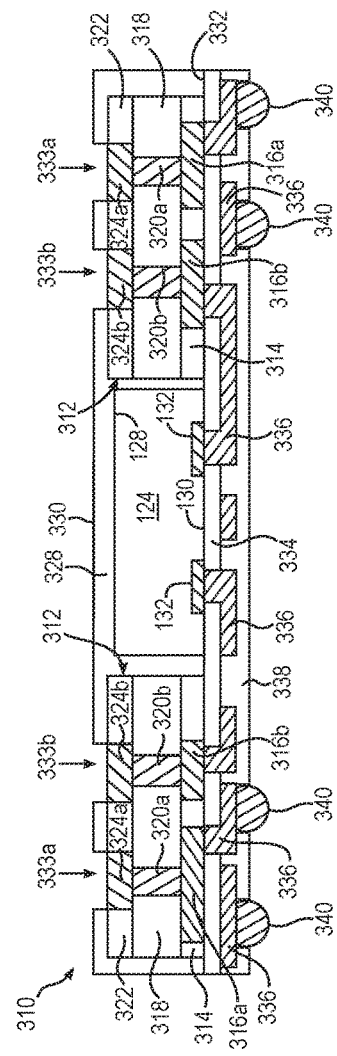

SEMICONDUCTOR DEVICE HAVING AN EMBEDDED CONDUCTIVE LAYER FOR POWER/GROUND PLANES IN FO-EWLB

CLAIM TO DOMESTIC PRIORITY

The present application is a continuation of U.S. patent application Ser. No. 15/605,010, now U.S. Pat. No. 10,741,416, filed May 25, 2017, which is a division of U.S. patent application Ser. No. 14/193,267, filed Feb. 28, 2014, now U.S. Pat. No. 9,685,350, which claims the benefit of U.S. Provisional Application No. 61/774,692, filed Mar. 8, 2013, which applications are incorporated herein by reference.

FIELD OF THE INVENTION

The present invention relates in general to semiconductor devices and, more particularly, to a semiconductor device and method of forming an embedded conductive layer to provide power/ground planes in a fan-out embedded wafer-level ball grid array (Fo-eWLB).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objective of smaller, thinner semiconductor devices is to focus on eWLB technology. A one redistribution layer embedded wafer-level ball grid array package (1L eWLB) provides a small, thin semiconductor device that has a high input/output (I/O) count and can incorporate semiconductor die having a high routing density. In a 1L eWLB, an encapsulant is formed around a semiconductor die and one redistribution layer (RDL) is formed over the encapsulant and semiconductor die for electrical interconnect. The RDL serves as an intermediate layer for electrical interconnect within the semiconductor device including electrical interconnect between the semiconductor die within the device and points external to the device. Forming a single RDL increases the I/O count of the semiconductor device, while maintaining a thin package profile. However, in a 1L eWLB, the power, signal, and ground traces are all designed within the single RDL, as opposed to spread over multiple RDLs. Forming the power, signal, and ground networks in a single RDL, eliminates the option of dedicating entire layers to providing power and ground planes. Without dedicated power and ground planes, routing design options are limited as power and ground traces need to be routed across the entire device to form an effective ground network and power distribution network (PDN). Forming ground and power networks within the single RDL consumes valuable real estate within the RDL and limits the space available for signal traces. In addition, without a dedicated ground plane layer electrostatic discharge (ESD) protection within the device is decreased. Finally, because a 1L eWLB has only the one conductive layer, i.e., RDL, microstrip lines and decoupling capacitors cannot be formed within the device.

BRIEF DESCRIPTION OF THE DRAWINGS

FIGS. 3a-3k illustrate a process of embedding a conductive layer adjacent to a semiconductor die to provide ground and power planes in a Fo-eWLB;

FIG. 5 illustrates a Fo-eWLB including an embedded conductive layer and a semiconductor die with a ground plane formed over a surface of the semiconductor die;

FIGS. 6a-6b illustrate a process of forming a dummy die including a conductive layer;

FIGS. 7a-7d illustrate a process of forming a Fo-eWLB including an embedded conductive layer formed over a dummy die;

FIG. 8 illustrates a Fo-eWLB including an embedded conductive layer formed over a dummy die;

FIG. 9 illustrates a Fo-eWLB including an embedded 3D interconnect unit providing ground and power planes in the Fo-eWLB;

DETAILED DESCRIPTION OF THE DRAWINGS

Figure 1:
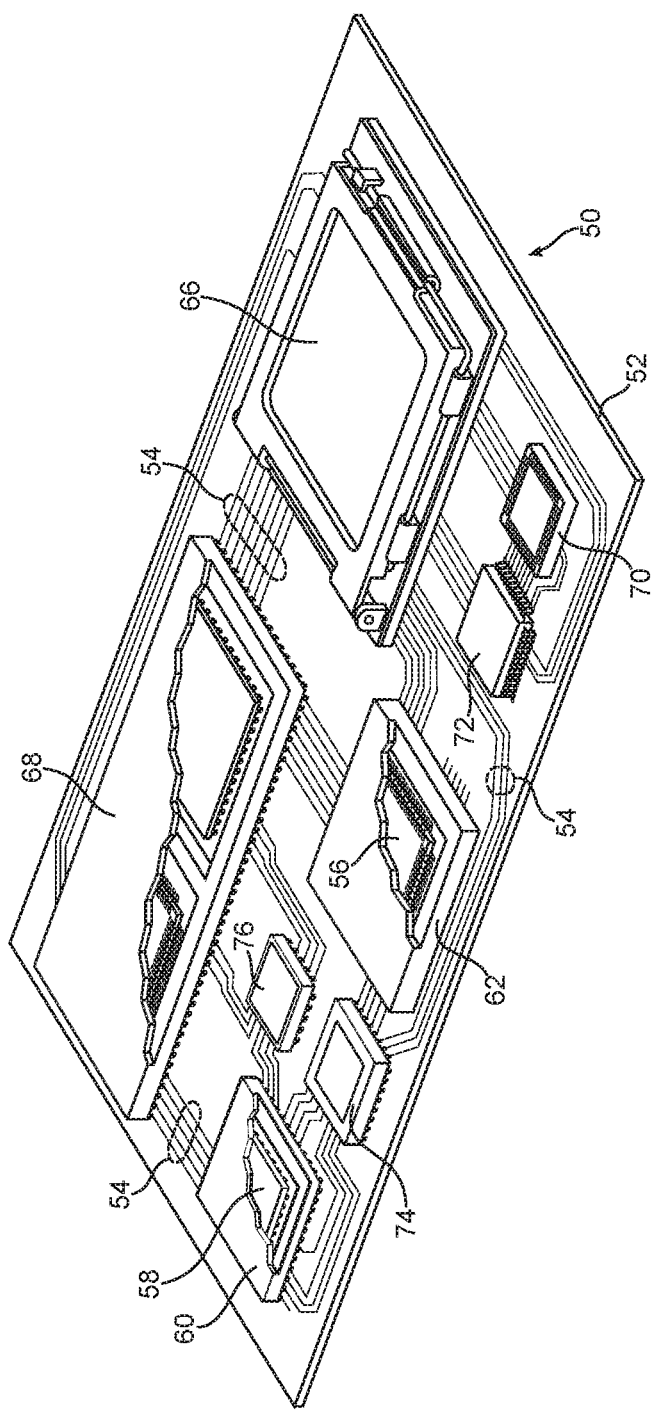
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
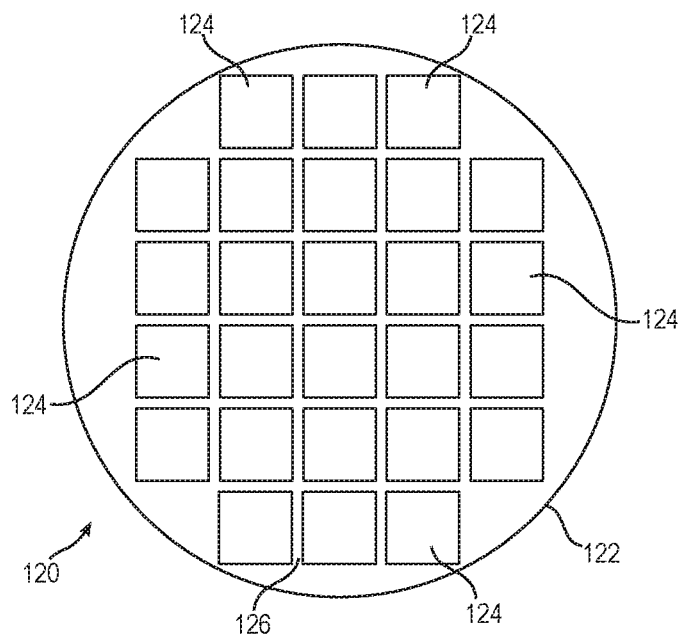
FIGS. 2a-2d illustrate a semiconductor wafer with a plurality of semiconductor die separated by a saw street.

FIG. 2a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 2B:
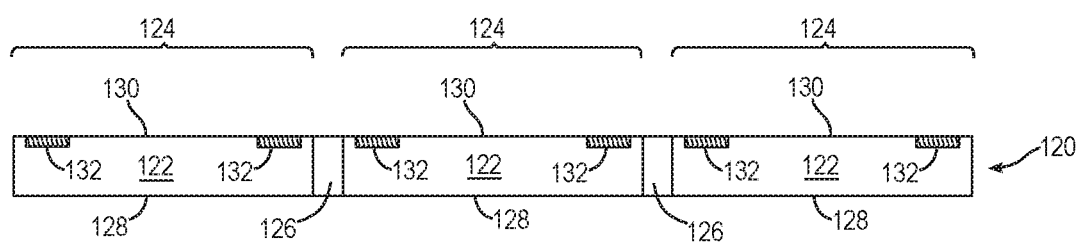

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
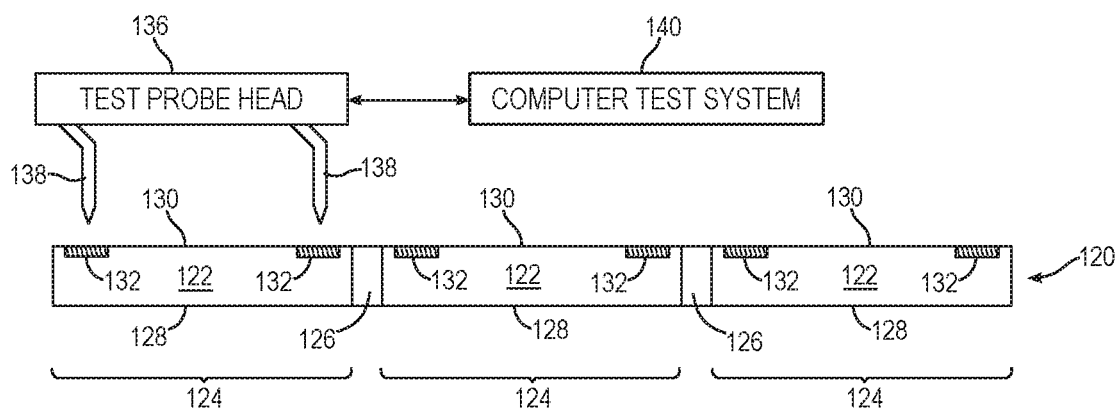

The active and passive components within semiconductor die 124 undergo testing at the wafer level for electrical performance and circuit function. Each semiconductor die 124 is tested for functionality and electrical parameters, as shown in FIG. 2c, using a probe 136 or other testing device. Test probe head 136 includes a plurality of probes 138. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
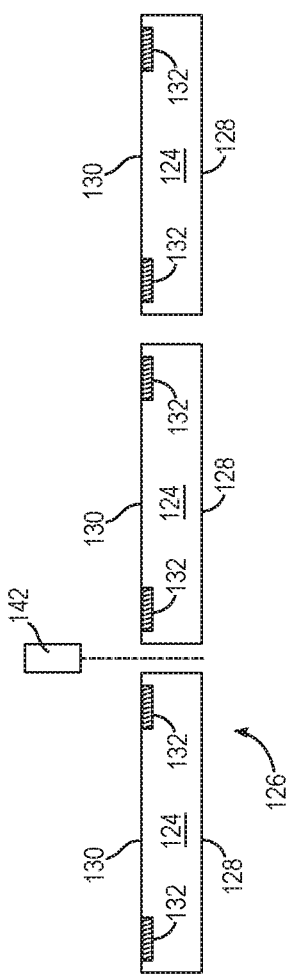

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3A:
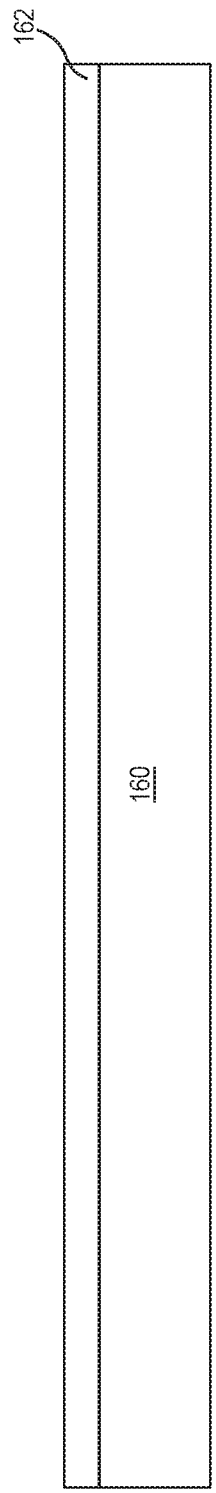

FIGS. 3a-3k illustrate, in relation to FIG. 1, a process of embedding a conductive layer adjacent to a semiconductor die to provide ground and power planes in a Fo-eWLB. FIG. 3a shows a cross-sectional view of a portion of a carrier or temporary substrate 160 containing sacrificial base material such as silicon, polymer, beryllium oxide, glass, or other suitable low-cost, rigid material for structural support. In one embodiment, carrier 160 is a carrier tape. An interface layer or double-sided tape 162 is formed over carrier 160 as a temporary adhesive bonding film, etch-stop layer, or thermal release layer.

Carrier 160 can be a round or rectangular panel (greater than 300 mm) with capacity for multiple semiconductor die 124. Carrier 160 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 160 is selected independent of the size of semiconductor die 124 or size of semiconductor wafer 120. That is, carrier 160 has a fixed or standardized size, which can accommodate various size semiconductor die 124 singulated from one or more semiconductor wafers 120. In one embodiment, carrier 160 is circular with a diameter of 330 mm. In another embodiment, carrier 160 is rectangular with a width of 560 mm and length of 600 mm. Semiconductor die 124 may have dimensions of 10 mm by 10 mm, which are placed on the standardized carrier 160. Alternatively, semiconductor die 124 may have dimensions of 20 mm by 20 mm, which are placed on the same standardized carrier 160. Accordingly, standardized carrier 160 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 160 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 3b, a conductive layer 164 is formed over carrier 160 and interface layer 162. Conductive layer 164 contains Al, Cu, Sn, Ni, Au, Ag, Ti, W, or other suitable electrically conductive material. Conductive layer 164 is formed as a laminated sheet or a tape on carrier 160 and interface layer 162. Conductive layer 164 can include a patterned lead frame, patterned Cu foil, resin coated (RCC) tape with patterned Cu, or prepreg with patterned Cu. Alternatively, conductive layer 164 is formed over carrier 160 and interface layer 162 using PVD, CVD, electrolytic plating, electroless plating process, or other suitable metal deposition process.

In FIG. 3c, semiconductor die 124 from FIG. 2d are mounted to carrier 160 and interface layer 162 using, for example, a pick and place operation with active surface 130 oriented toward carrier 160. Conductive layer 164 is disposed in a peripheral region of semiconductor die 124. Alternatively, conductive layer 164 can be formed after semiconductor die 124 are mounted to carrier 160 and interface layer 162. FIG. 3d shows semiconductor die 124 and conductive layer 164 mounted to carrier 160 as reconstituted or reconfigured wafer 166.

FIG. 3e shows a plan view of semiconductor die 124 and conductive layer 164 mounted to interface layer 162 and carrier 160. Conductive layer 164 includes three portions 164a, 164b, and 164c. Portions 164a-164c are disposed adjacent to three side surfaces of semiconductor die 124. Alternatively, conductive layer 164 may include two portions disposed adjacent to two side surfaces of semiconductor die 124, four portions disposed around four side surfaces of semiconductor die 124, or two portions disposed adjacent to one side surface of semiconductor die 124. Any number and/or configuration of conductive layers 164 may be disposed adjacent to semiconductor die 124 depending on the routing design and function of the semiconductor package.

In FIG. 3f, an encapsulant or molding compound 168 is deposited over semiconductor die 124, conductive layers 164a-164c, and carrier 160 using a paste printing, compressive molding, transfer molding, liquid encapsulant molding, vacuum lamination, spin coating, or other suitable applicator. Encapsulant 168 can be polymer composite material, such as epoxy resin with filler, epoxy acrylate with filler, or polymer with proper filler. Encapsulant 168 is non-conductive and environmentally protects the semiconductor device from external elements and contaminants. Encapsulant 168 also protects semiconductor die 124 from degradation due to exposure to light. In one embodiment, a portion of encapsulant 168 is removed from surface 170 of encapsulant 168 in a subsequent backgrinding step. The backgrinding operation planarizes the surface of encapsulant 168 and reduces an overall thickness of reconstituted wafer 166. A surface 172 of encapsulant 168 opposite surface 170 is disposed over carrier 160 and interface layer 162 such that surface 172 of encapsulant 168 is substantially coplanar with active surface 130 of semiconductor die 124.

In FIG. 3g, carrier 160 and interface layer 162 are removed by chemical etching, mechanical peeling, chemical mechanical planarization (CMP), mechanical grinding, thermal bake, UV light, laser scanning, or wet stripping. Removing carrier 160 and interface layer 162 exposes surface 172 of encapsulant 168, active surface 130 of semiconductor die 124, and conductive layers 164a-164c.

In FIG. 3h, an insulating or passivation layer 180 is formed over surface 172 of encapsulant 168, active surface 130 of semiconductor die 124, and conductive layers 164a-164c using PVD, CVD, printing, lamination, spin coating, spray coating, sintering, or thermal oxidation. Insulating layer 180 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 180 is removed by laser direction ablation (LDA), etching, or other suitable process to expose portions of conductive layer 132 and conductive layers 164a-164c.

In FIG. 3i, an electrically conductive layer or RDL 182 is formed over insulating layer 180 using a patterning and metal deposition process such as sputtering, electrolytic plating, or electroless plating. Conductive layer 182 can be one or more layers of Al, Cu, Sn, Ni, Au, Ag, or other suitable electrically conductive material. One portion of conductive layer 182 is electrically connected to conductive layer 132. Other portions of conductive layer 182 can be electrically common or electrically isolated depending on the design and function of semiconductor die 124. Conductive layer 182 electrically connects semiconductor die 124 to embedded conductive layers 164a-164c. Conductive layer 182 provides signal routing and power and ground connections within the semiconductor package.

Figure 3J:
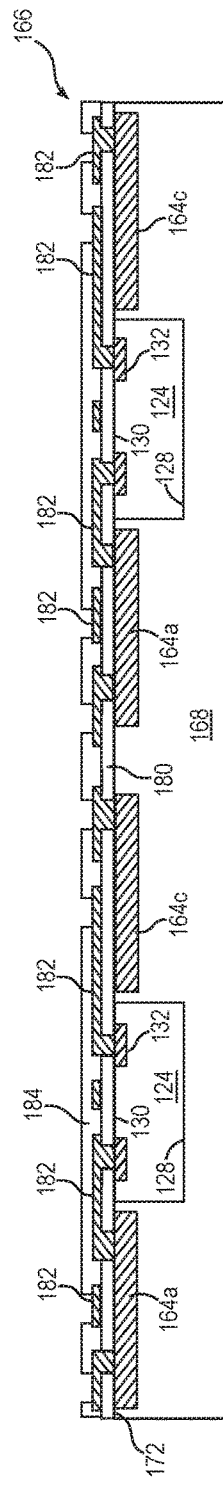

In FIG. 3j, an insulating or passivation layer 184 is formed over insulating layer 180 and conductive layer 182 using PVD, CVD, printing, lamination, spin coating, spray coating, sintering, or thermal oxidation. Insulating layer 184 contains one or more layers of SiO2, Si3N4, SiON, Ta2O5, Al2O3, or other material having similar insulating and structural properties. A portion of insulating layer 184 is removed by LDA, etching, or other suitable process to expose conductive layer 182.

Figure 3K:
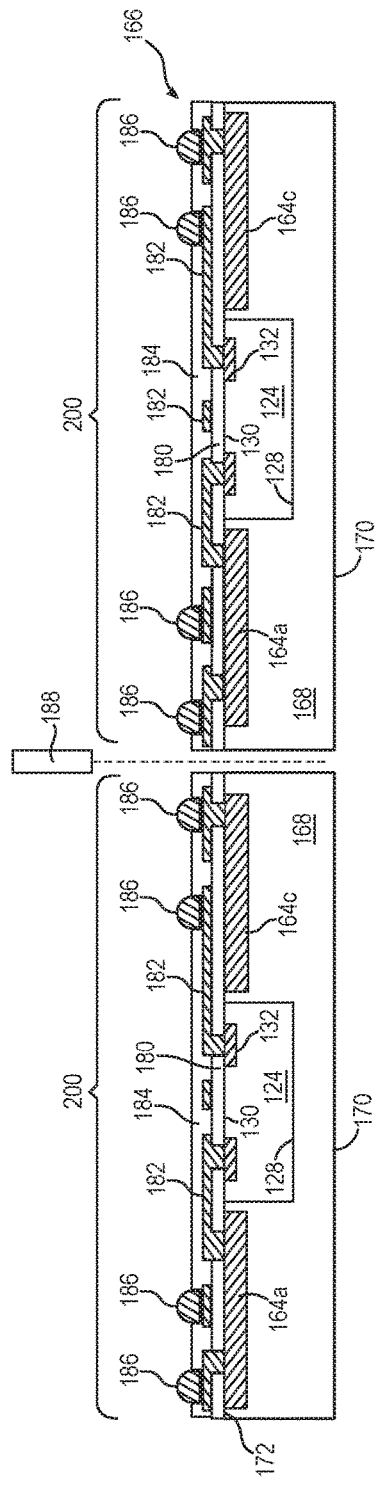

In FIG. 3k, an electrically conductive bump material is deposited over conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above the material's melting point to form balls or bumps 186. In some applications, bumps 186 are reflowed a second time to improve electrical contact to conductive layer 182. In one embodiment, bumps 186 are formed over an under bump metallization (UBM) layer. Bumps 186 can also be compression bonded or thermocompression bonded to conductive layer 182. Bumps 186 represent one type of interconnect structure that can be formed over conductive layer 182. The interconnect structure can also use bond wires, conductive paste, stud bump, micro bump, or other electrical interconnect.

Conductive layers 164a-164c are electrically connected through conductive layer 182 to bumps 186 for connection to an external positive voltage terminal ($V_{DD}$) or negative voltage terminal ($V_{SS}$). Conductive layer 164a can be connected to $V_{DD}$ or to $V_{SS}$. Conductive layer 164b can be connected to $V_{DD}$ or to $V_{SS}$. Conductive layer 164c can be connected to $V_{DD}$ or to $V_{SS}$. In one embodiment, conductive layer 164a is connected to $V_{DD}$, conductive layer 164b is connected to $V_{SS}$, and conductive layer 164c is connected to $V_{SS}$. $V_{DD}$ can be connected to conductive layer 164a, conductive layer 164b, and/or conductive layer 164c. $V_{SS}$ can be connected to conductive layer 164a, conductive layer 164b, and/or conductive layer 164c.

The portions of conductive layers 164a-164c connected to $V_{SS}$ form a ground plane. The portions of conductive layers 164a-164c connected to $V_{DD}$ form a power plane. The ground plane provided by conductive layers 164a-164c is disposed underneath insulating layer 180 and is electrically isolated from signal traces of conductive layer 182. Power traces of conductive layer 182 are formed between semiconductor die 124 and the power plane provided by conductive layers 164a-164c. The power traces supply power to semiconductor die 124 by connecting to any part of the power plane. The location of the power plane, i.e., conductive layers 164a-164c, and the location of the power traces are selected to minimize trace length.

Figure 4:
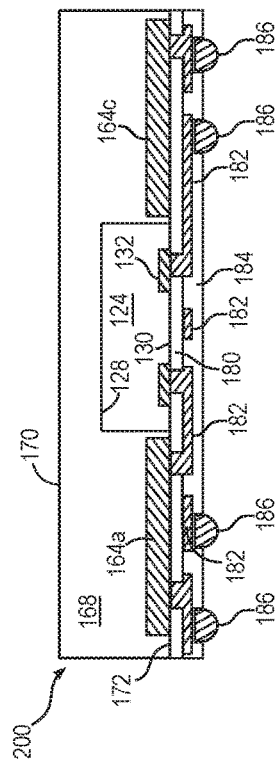
FIG. 4 illustrates a Fo-eWLB including an embedded conductive layer providing ground and power planes in the Fo-eWLB.

Reconstituted wafer 166 is singulated through encapsulant 168 using saw blade or laser cutting tool 188 into individual Fo-eWLB 200. FIG. 4 shows Fo-eWLB 200 after singulation. Semiconductor die 124 is electrically connected through conductive layer 182 to bumps 186 for connection to external devices, e.g., a PCB. Conductive layers 164a-164c are embedded in encapsulant 168 in a peripheral region of semiconductor die 124. Conductive layers 164a-164c are electrically connected through conductive layer 182 to bumps 186 for connection to an external $V_{DD}$ or $V_{SS}$. Embedded conductive layers 164a-164c form ground and power planes adjacent to semiconductor die 124. Embedded conductive layers 164a-164c provide ground and power planes without requiring formation of additional RDLs over conductive layer 182. Forming less RDLs increases package reliability and decreases an overall thickness of Fo-eWLB 200.

Forming a power plane adjacent to semiconductor die 124 increases flexibility in routing design. Power traces can be connected to any part of the power plane, and conductive layers 164a-164c can be disposed anywhere a $V_{DD}$ connection is needed. The increased flexibility in routing design allows for the shortest possible traces length. Decreased trace length creates a more efficient PDN and increases the speed and functionality of Fo-eWLB 200.

The ground plane provided by conductive layers 164a-164c is disposed underneath insulating layer 180 and is electrically isolated from signal traces of conductive layer 182. Disposing insulating layer 180 and signal traces of conductive layer 182 over the ground plane facilitates the formation of microstrip lines across Fo-eWLB 200. Microstrip lines convey microwave frequency signals and allow microwave components, e.g., antennas, couplers, filters, power dividers, etc., to be incorporated into Fo-eWLB 200. Forming a ground plane also increases ESD protection within Fo-eWLB 200.

Embedded conductive layers 164a-164c provide an additional conductive layer within Fo-eWLB 200. The additional conductive layer is used to form a decoupling capacitor. The decoupling capacitor is formed by designing a power network in conductive layer 182 over insulating layer 180 and a portion of conductive layers 164a-164c. In one embodiment, the power network, i.e., traces of conductive layer 182 that supply power to semiconductor die 124, is designed to extend over conductive layer 164c such that the power network, insulating layer 180, and conductive layer 164c form the decoupling capacitor. Incorporating a decoupling capacitor into Fo-eWLB 200 reduces voltage fluctuation and increases the electrical performance of Fo-eWLB 200.

Conductive layers 164a-164c are formed as a laminated sheet or a tape on carrier 160. Forming conductive layers 164a-164c on carrier 160 is faster, less expensive, and lower risk than forming additional RDLs, which require complex, highly controlled, expensive, and time-consuming manufacturing steps. Providing power and ground planes and an additional conductive layer by forming conductive layers 164a-164c adjacent to semiconductor die 124 reduces manufacturing time, increases throughput, and decreases an overall cost of Fo-eWLB 200. Embedded conductive layers 164a-164c increase the electrical performance and functionality of Fo-eWLB 200, without increasing package thickness.

FIG. 5 shows a Fo-eWLB 220 similar to Fo-eWLB 200 in FIG. 4. Fo-eWLB 220 includes a semiconductor die 224 singulated from a wafer similar to wafer 120. Semiconductor die 224 has a back or non-active surface 228 and an active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 224 may also contain IPDs, such as inductors, capacitors, and resistors, for RF signal processing.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230. Conductive layer 232 can be formed as contact pads disposed side-by-side a first distance from the edge of semiconductor die 224. Alternatively, conductive layer 232 can be formed as contact pads that are offset in multiple rows such that a first row of contact pads is disposed a first distance from the edge of the die, and a second row of contact pads alternating with the first row is disposed a second distance from the edge of the die.

An insulating layer or passivation layer 234 is formed over semiconductor die 224 using PVD, CVD, printing, lamination, spin coating, spray coating, sintering, or thermal oxidation. Insulating layer 234 contains one or more layers of $SiO_2$, $Si_3N_4$, SiON, $Ta_2O_5$, $Al_2O_3$, or other material having similar insulating and structural properties. A portion of insulating layer 234 is removed by LDA, etching, or other suitable process to expose conductive layer 232.

An electrically conductive layer 236 is formed over insulating layer 234 using PVD, CVD, electrolytic plating, electroless plating process, or other suitable metal deposition process. Conductive layer 236 can be one or more layers of Al, Cu, Sn, Ni, Au, Ag, or other suitable electrically conductive material. Conductive layer 236 is formed over semiconductor die 224 at the wafer level, i.e., prior to singulation. Conductive layer 236 is electrically connected through conductive layer 182 and bumps 186 to an external $V_{SS}$. Conductive layer 236 forms an additional ground plane in Fo-eWLB 220.

FIGS. 6a-6b illustrate a process of forming a dummy die including a conductive layer. FIG. 6a shows a cross-sectional view of a portion of a semiconductor wafer 240 with a base substrate material 242, such as silicon, germanium, gallium arsenide, indium phosphide, or silicon carbide, for structural support. A plurality of dummy die 250 is formed on wafer 240. Dummy die 250 are separated by a non-active, inter-die wafer area or saw street 248. Saw street 248 provides cutting areas to singulate semiconductor wafer 240 into individual dummy die 250. In one embodiment, semiconductor wafer 240 has a width or diameter of 200-300 mm. In another embodiment, semiconductor wafer 240 has a width or diameter of 100-450 mm.

Each dummy die 250 has opposing surface 244 and 246. An electrically conductive layer 252 is formed over surface 244 using PVD, CVD, electrolytic plating, electroless plating process, or other suitable metal deposition process. Conductive layer 252 can be one or more layers of Al, Cu, Sn, Ni, Au, Ag, or other suitable electrically conductive material. In one embodiment, conductive layer 252 is electroplated Cu.

In FIG. 6b, semiconductor wafer 240 is singulated through saw street 248 using a saw blade or laser cutting tool 254 into individual dummy die 250 including conductive layer 252. Dummy die 250 can be singulated to any size or shape depending on the routing design and function of the semiconductor package incorporating dummy die 250.

Figure 7A:
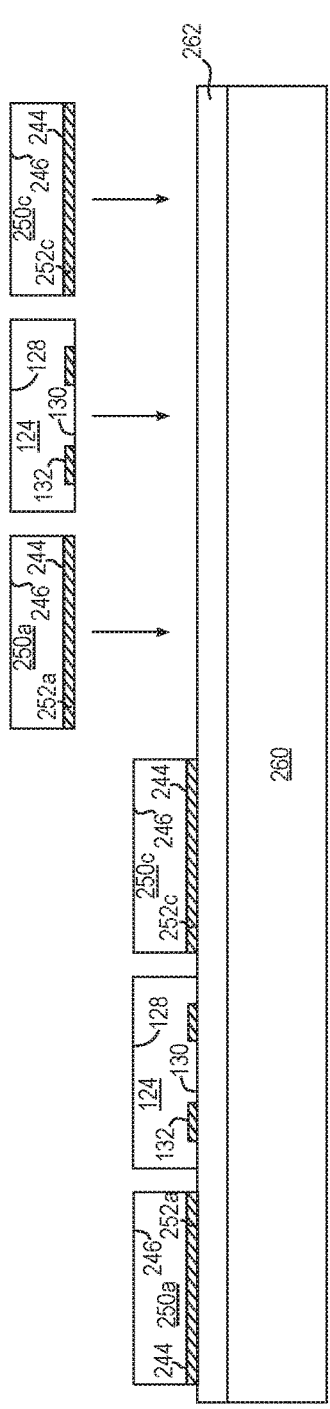

FIGS. 7a-7d illustrate, in relation to FIG. 1, a process of forming a Fo-eWLB including an embedded conductive layer formed over a dummy die. FIG. 7a shows a cross-sectional view of a portion of a carrier or temporary substrate 260, similar to carrier 160 in FIG. 3a, containing sacrificial base material such as silicon, polymer, beryllium oxide, glass, or other suitable low-cost, rigid material for structural support. In one embodiment, carrier 260 is a carrier tape. An interface layer or double-sided tape 262 is formed over carrier 260 as a temporary adhesive bonding film, etch-stop layer, or thermal release layer.

Semiconductor die 124 from FIG. 2d and dummy die 250a-250c from FIG. 6b are mounted to interface layer 262 and carrier 260 using, for example, a pick and place operation with active surface 130 of semiconductor die 124 and conductive layers 252a-252c of dummy die 250a-250c oriented toward carrier 260. In one embodiment, a ground plane layer, similar to conductive layer 236 in FIG. 5, is formed over surface 130 of semiconductor die 124.

Figure 7B:
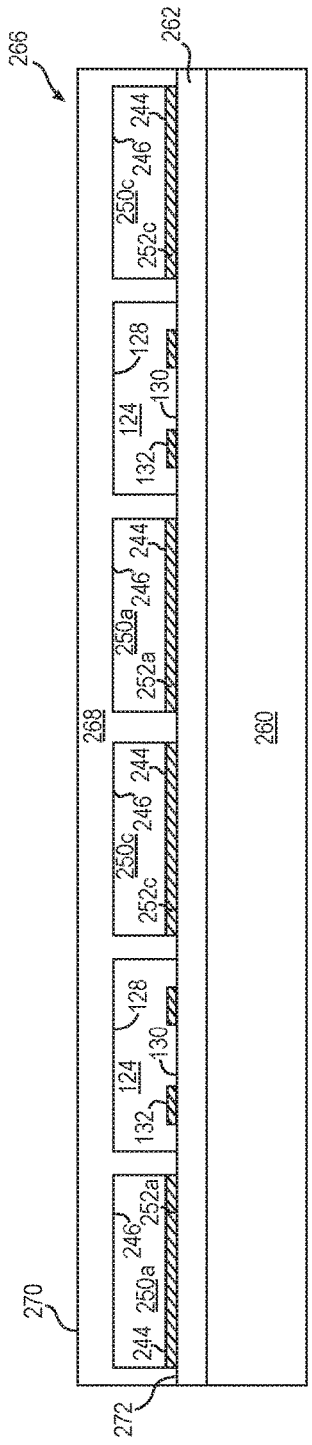

FIG. 7b shows semiconductor die 124 and dummy die 250a-250c disposed over carrier 260 as reconstituted or reconfigured wafer 266. Dummy die 250a-250c are disposed around the side surfaces of semiconductor die 124 similar to conductive layers 164a, 164b, and 164c in FIG. 3e. Alternatively, dummy die 250a-250c may be disposed adjacent to one side surface of semiconductor die 124, two side surfaces of semiconductor die 124, or around all side surfaces of semiconductor die 124. Any number and/or configuration of dummy die 250 may be disposed adjacent to semiconductor die 124 depending on the routing design and function of the semiconductor package.

An encapsulant or molding compound 268 is deposited over semiconductor die 124, dummy die 250a-250c, and carrier 260 using a paste printing, compressive molding, transfer molding, liquid encapsulant molding, vacuum lamination, spin coating, or other suitable applicator. Encapsulant 268 can be polymer composite material, such as epoxy resin with filler, epoxy acrylate with filler, or polymer with proper filler. Encapsulant 268 is non-conductive and environmentally protects the semiconductor device from external elements and contaminants. Encapsulant 268 also protects semiconductor die 124 from degradation due to exposure to light. In one embodiment, a portion of encapsulant 268 is removed from surface 270 of encapsulant 268 in a subsequent backgrinding step. The backgrinding operation planarizes the surface of encapsulant 268 and reduces an overall thickness of reconstituted wafer 266. A surface 272 of encapsulant 268 opposite surface 270 is disposed over carrier 260 and interface layer 262 such that surface 272 of encapsulant 268 is substantially coplanar with active surface 130 of semiconductor die 124 and conductive layer 252 of dummy die 250.

Figure 7C:
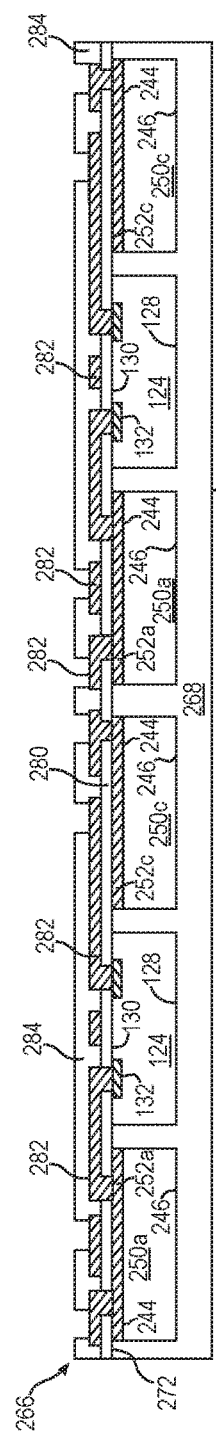

In FIG. 7c, carrier 260 and interface layer 262 are removed by chemical etching, mechanical peeling, CMP, mechanical grinding, thermal bake, UV light, laser scanning, or wet stripping. Removing carrier 260 and interface layer 262 exposes surface 272 of encapsulant 268, active surface 130 of semiconductor die 124, and conductive layers 252a-252c of dummy die 250a-250c.

An insulating or passivation layer 280 is formed over surface 272 of encapsulant 268, active surface 130 of semiconductor die 124, and conductive layers 252a-252c of dummy die 250a-250c using PVD, CVD, printing, lamination, spin coating, spray coating, sintering, or thermal oxidation. Insulating layer 280 contains one or more layers of SiO2, Si3N4, SiON, Ta2O5, Al2O3, or other material having similar insulating and structural properties. A portion of insulating layer 280 is removed by LDA, etching, or other suitable process to expose conductive layer 132 and conductive layers 252a-252c.

An electrically conductive layer or RDL 282 is formed over insulating layer 280 using a patterning and metal deposition process such as sputtering, electrolytic plating, or electroless plating. Conductive layer 282 can be one or more layers of Al, Cu, Sn, Ni, Au, Ag, or other suitable electrically conductive material. One portion of conductive layer 282 is electrically connected to conductive layer 132. Other portions of conductive layer 282 can be electrically common or electrically isolated depending on the design and function of semiconductor die 124. Conductive layer 282 electrically connects semiconductor die 124 to conductive layers 252a-252c. Conductive layer 282 provides signal routing and power and ground connections within the semiconductor package.

An insulating or passivation layer 284 is formed over insulating layer 280 and conductive layer 282 using PVD, CVD, printing, lamination, spin coating, spray coating, sintering, or thermal oxidation. Insulating layer 284 contains one or more layers of SiO2, Si3N4, SiON, Ta2O5, Al2O3, or other material having similar insulating and structural properties. A portion of insulating layer 284 is removed by LDA, etching, or other suitable process to expose conductive layer 282.

In FIG. 7d, an electrically conductive bump material is deposited over conductive layer 282 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 282 using a suitable attachment or bonding process. In one embodiment, the bump material is reflowed by heating the material above the material's melting point to form balls or bumps 286. In some applications, bumps 286 are reflowed a second time to improve electrical contact to conductive layer 282. In one embodiment, bumps 286 are formed over a UBM layer. Bumps 286 can also be compression bonded or thermocompression bonded to conductive layer 282. Bumps 286 represent one type of interconnect structure that can be formed over conductive layer 282. The interconnect structure can also use bond wires, conductive paste, stud bump, micro bump, or other electrical interconnect.

Conductive layers 252a-252c are electrically connected through conductive layer 282 to bumps 286 for connection to an external $V_{SS}$ or $V_{DD}$. Conductive layers 252a can be connected to $V_{SS}$ or to $V_{DD}$. Conductive layers 252c can be connected to $V_{SS}$ or to $V_{DD}$. In one embodiment, conductive layers 252a are connected to $V_{DD}$, and conductive layers 252c are connected to $V_{SS}$. $V_{DD}$ can be connected to conductive layers 252a and/or conductive layers 252c. $V_{SS}$ can be connected to conductive layers 252a and/or conductive layers 252c.

The conductive layers 252a-252c connected to $V_{SS}$ form a ground plane. The conductive layers 252a-252c connected to $V_{DD}$ form a power plane. The ground plane provided by conductive layers 252a-252c is disposed underneath insulating layer 280 and is electrically isolated from signal traces of conductive layer 282. Power traces of conductive layer 282 are formed between semiconductor die 124 and the power plane provided by conductive layers 252a-252c. The power traces supply power to semiconductor die 124 by connecting to any part of the power plane. The location of the power plane, i.e., conductive layers 252a-252c connected to $V_{DD}$, and the location of the power traces are selected to minimize trace length.

Reconstituted wafer 266 is singulated through encapsulant 268 using saw blade or laser cutting tool 288 into individual Fo-eWLB 300. FIG. 8 shows Fo-eWLB 300 after singulation. Semiconductor die 124 is electrically connected through conductive layer 282 to bumps 286 for connection to external devices, e.g., a PCB. Dummy die 250a-250c are embedded in encapsulant 268 in a peripheral region of semiconductor die 124. Conductive layers 252a-252c are electrically connected through conductive layer 282 to bumps 286 for connection to an external $V_{SS}$ or $V_{DD}$. Conductive layers 252a-252c form ground and power planes adjacent to semiconductor die 124. Embedded dummy die 250a-250c and conductive layers 252a-252c provide ground and power planes without requiring formation of additional RDLs over conductive layer 282. Forming less RDLs increases package reliability and decreases an overall thickness of Fo-eWLB 300.

Forming a power plane by disposing a dummy die adjacent to semiconductor die 124 increases flexibility in routing design. Dummy die 250a-250c can be disposed anywhere a power connection is needed and power traces can be connected to any part of conductive layers 252a-252c. The increased flexibility in routing design allows for the shortest possible traces length. Decreased trace length creates a more efficient PDN and increases the speed and functionality of Fo-eWLB 300.

The ground plane provided by conductive layers 252a-252c is disposed underneath insulating layer 280 and is electrically isolated from signal traces of conductive layer 282. Disposing insulating layer 280 and signal traces of conductive layer 282 over the ground plane facilitates the formation of microstrip lines across Fo-eWLB 300. Microstrip lines convey microwave frequency signals and allow microwave components, e.g., antennas, couplers, filters, power dividers, etc., to be incorporated into Fo-eWLB 300. Forming a ground plane also increases ESD protection within Fo-eWLB 300.

Embedded dummy die 250a-250c provide an additional conductive layer within Fo-eWLB 300. The additional conductive layer is used to form a decoupling capacitor. The decoupling capacitor is formed by designing a power network in conductive layer 282 over insulating layer 280 and a portion of conductive layers 252a-252c. In one embodiment, the power network, i.e., traces of conductive layer 282 that supply power to semiconductor die 124, is designed to extend over conductive layer 252c such that the power network, insulating layer 280, and conductive layer 252c form the decoupling capacitor. Incorporating a decoupling capacitor into Fo-eWLB 300 reduces voltage fluctuation and increases the electrical performance of Fo-eWLB 300.

Conductive layers 252a-252c are formed over dummy die 250a-250c on a wafer level, i.e., prior to singulation of wafer 240. Conductive layers 252a-252c can be formed and dummy die 250a-250c can be singulated to any shape or size depending on the design and routing requirements of semiconductor die 124 and Fo-eWLB 300. Dummy die 250a-250c are mounted to carrier 260 using a pick and place method. Mounting preformed dummy die 250a-250c with conductive layers 252a-252c to carrier 260 is faster, less expensive, and lower risk than forming additional RDLs, which require complex, highly controlled, expensive, and time-consuming manufacturing steps. Providing an additional conductive layer and ground and power planes by embedding dummy die 250a-250c reduces manufacturing time, increases throughput, and decreases an overall cost of Fo-eWLB 300. Embedded dummy die 250a-250c increase the electrical performance and functionality of Fo-eWLB 300, without increasing package thickness.

FIG. 9 shows a Fo-eWLB 310 including semiconductor die 124 and embedded three-dimensional (3D) interconnection units or interposers 312. Interconnect units 312 include insulating layers 314, 318, and 322, and conductive layers 316, 320, and 324. In one embodiment, interconnect unit 312 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Interconnect unit 312 can also be a multi-layer flexible laminate, ceramic, copper foil, glass, or semiconductor wafer including an active surface containing one or more transistors, diodes, and other circuit elements to implement analog circuits or digital circuits.

Insulating layers 314, 318, and 322 of interconnect unit 312 are formed using PVD, CVD, printing, lamination, spin coating, spray coating, sintering, or thermal oxidation. Insulating layers 314, 318, and 322 contain one or more layers of $SiO_2$, $Si_3N_4$, SiON, $Ta_2O_5$, $Al_2O_3$, or other material having similar insulating and structural properties. Conductive layers 316, 320, and 324 of interconnect unit 312 are formed using a patterning and metal deposition process such as sputtering, electrolytic plating, and electroless plating. Conductive layers 316, 320, and 324 can be one or more layers of Al, Cu, Sn, Ni, Au, Ag, Ti, W, or other suitable electrically conductive material. Conductive layers 316, 320, and 324 include lateral RDL and vertical conductive vias and provide electrical interconnect through Fo-eWLB 310. Portion 316a of conductive layer 316 and portion 324a of conductive layer 324 are electrically connected through portion 320a of conductive layer 320. Portion 316b of conductive layer 316 and portion 324b of conductive layer 324 are electrically connected through portion 320b of conductive layer 320. One portion 316a is electrically connected to an external $V_{SS}$ and forms a ground plane layer in Fo-eWLB 310. Another portion 316a is electrically connected to an external $V_{DD}$ and forms a power plane layer in Fo-eWLB 310. Other portions of conductive layers 316, 320, and 324 may be electrically common or electrically isolated depending on the routing design and function of Fo-eWLB 310.

Interconnect units 312 are disposed around three side surfaces of semiconductor die 124, similar to conductive layers 164a, 164b, and 164c in FIG. 3e. Alternatively, interconnect units 312 may be disposed adjacent to one side surface of semiconductor die 124, two side surfaces of semiconductor die 124, or around all four side surfaces of semiconductor die 124. Any number and/or configuration of interconnect units 312 may be disposed adjacent to semiconductor die 124 depending on the routing design and function of the Fo-eWLB 310. In one embodiment, a ground plane layer, similar to conductive layer 236 in FIG. 5, is formed over surface 130 of semiconductor die 124.

An encapsulant or molding compound 328 is deposited over semiconductor die 124 and interconnect units 312 using a paste printing, compressive molding, transfer molding, liquid encapsulant molding, vacuum lamination, spin coating, or other suitable applicator. Encapsulant 328 can be polymer composite material, such as epoxy resin with filler, epoxy acrylate with filler, or polymer with proper filler. Encapsulant 328 is non-conductive and environmentally protects the semiconductor device from external elements and contaminants. Encapsulant 328 also protects semiconductor die 124 from degradation due to exposure to light. In one embodiment, a portion of encapsulant 328 is removed from surface 330 of encapsulant 328 in a subsequent backgrinding step. The backgrinding operation planarizes the surface of encapsulant 328 and reduces an overall thickness of Fo-eWLB 310. A surface 332 of encapsulant 328 opposite surface 330 is substantially coplanar with active surface 130 of semiconductor die 124.

A plurality of openings 333 are formed in surface 330 of encapsulant 328. Openings 333 are formed by LDA, etching, or other suitable process. Openings 333 expose portions of conductive layer 324, which act as contact pads and facilitate electrical interconnection between Fo-eWLB 310 and semiconductor die or components stacked over Fo-eWLB 310. Openings 333a expose ground pads and power pads. Ground pads are portions of conductive layer 324 that are coupled to a ground plane portion 316a of conductive layer 316. Power pads are portions of conductive layer 324 that are coupled to a power plane portion 316a of conductive layer 316. Openings 333b expose signal pads. Signal pads are portions of conductive layer 324 that facilitate signal routing and communication between Fo-eWLB 310 and semiconductor die or components disposed over Fo-eWLB 310.

An insulating or passivation layer 334 is formed over surface 332 of encapsulant 328, active surface 130 of semiconductor die 124, and insulating layer 314 and conductive layer 316 of interconnect unit 312 using PVD, CVD, printing, lamination, spin coating, spray coating, sintering, or thermal oxidation. Insulating layer 334 contains one or more layers of SiO2, Si3N4, SiON, Ta2O5, Al2O3, or other material having similar insulating and structural properties. A portion of insulating layer 334 is removed by LDA, etching, or other suitable process to expose conductive layer 132 and conductive layer 316.

An electrically conductive layer or RDL 336 is formed over insulating layer 334 using a patterning and metal deposition process such as sputtering, electrolytic plating, or electroless plating. Conductive layer 336 can be one or more layers of Al, Cu, Sn, Ni, Au, Ag, or other suitable electrically conductive material. One portion of conductive layer 336 is electrically connected to conductive layer 132. One portion of conductive layer 336 is electrically connected portions 316a of interconnect unit 312. One portion of conductive layer 336 is electrically connected to portion 316b of conductive layer 316. Other portions of conductive layer 336 can be electrically common or electrically isolated depending on the design and function of semiconductor die 124. Conductive layer 336 provides signal routing and power and ground connections within the Fo-eWLB 310.

An insulating or passivation layer 338 is formed over insulating layer 334 and conductive layer 336 using PVD, CVD, printing, lamination, spin coating, spray coating, sintering, or thermal oxidation. Insulating layer 338 contains one or more layers of SiO2, Si3N4, SiON, Ta2O5, Al2O3, or other material having similar insulating and structural properties. A portion of insulating layer 338 is removed by LDA, etching, or other suitable process to expose conductive layer 336.

An electrically conductive bump material is deposited over conductive layer 336 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 336 using a suitable attachment or bonding process. In one embodiment, the bump material is reflowed by heating the material above the material's melting point to form balls or bumps 340. In some applications, bumps 340 are reflowed a second time to improve electrical contact to conductive layer 336. In one embodiment, bumps 340 are formed over a UBM layer. Bumps 340 can also be compression bonded or thermocompression bonded to conductive layer 336. Bumps 340 represent one type of interconnect structure that can be formed over conductive layer 336. The interconnect structure can also use bond wires, conductive paste, stud bump, micro bump, or other electrical interconnect.

Conductive layers 316a of interconnect units 312 are electrically connected through conductive layer 336 to bumps 340 for connection to an external $V_{SS}$ or $V_{DD}$. Each conductive layer 316a can be connected to $V_{SS}$ or to $V_{DD}$. $V_{SS}$ may be connected to any conductive layer 316a. $V_{DD}$ may be connected to any conductive layer 316a. Conductive layers 316a that are connected to $V_{SS}$ form a ground plane in Fo-eWLB 310. Conductive layers 316a that are connected to $V_{DD}$ form a power plane in Fo-eWLB 310. The ground plane 316a is electrically isolated from the power plane 316a.

The ground plane provided by interconnect units 312 is disposed underneath insulating layer 334 and is electrically isolated from signal traces of conductive layer 336. Power traces of conductive layer 336 are formed between semiconductor die 124 and the power plane provided by conductive layers 316a. The power traces can be formed between semiconductor die 124 and any part of the power plane, i.e., any conductive layer 316a connected to $V_{DD}$. The location of interconnect units 312, the location of the power plane, and the location of the power traces are selected to minimize trace length.

Semiconductor die 124 is electrically connected through conductive layer 336 to bumps 340 for connection to external devices, e.g., a PCB. Interconnect units 312 are embedded in encapsulant 328 in a peripheral region of semiconductor die 124. Interconnect units 312 are electrically connected to conductive layer 336 and provide signal, power, and ground connections to semiconductor die or components disposed over Fo-eWLB 310. Conductive layers 316a are electrically connected through conductive layer 336 to bumps 340 for connection to an external $V_{SS}$ or $V_{DD}$. Conductive layers 316a form ground and power planes adjacent to semiconductor die 124. Embedded interconnect units 312 provide ground and power planes without requiring formation of additional RDLs over conductive layer 336. Forming less RDLs increases package reliability and decreases an overall thickness of Fo-eWLB 310.

Forming a power plane by disposing interconnect units 312 adjacent to semiconductor die 124 increases flexibility in routing design. Interconnect units 312 can be disposed anywhere a power plane is needed and power traces of conductive layer 336 can connect to any portion of the power plane, i.e., any conductive layer 316a connected to $V_{DD}$. The increased flexibility in routing design allows for the shortest possible traces length. Decreased trace length creates a more efficient PDN and increases the speed and functionality of Fo-eWLB 310.

The ground plane provided by conductive layers 316a is disposed underneath insulating layer 334 and is electrically isolated from signal traces of conductive layer 336. Disposing insulating layer 334 and signal traces of conductive layer 336 over the ground plane facilitates the formation of microstrip lines across Fo-eWLB 310. Microstrip lines convey microwave frequency signals and allow microwave components, e.g., antennas, couplers, filters, power dividers, etc., to be incorporated into Fo-eWLB 310. Forming a ground plane also increases ESD protection within Fo-eWLB 310.

Embedded interconnect units 312 provide an additional conductive layer within Fo-eWLB 310. The additional conductive layer is used to form a decoupling capacitor. The decoupling capacitor is formed by designing a power network in conductive layer 336 over insulating layer 334 and a portion of conductive layers 316a. In one embodiment, the power network, i.e., portions of conductive layer 336 that supply power to semiconductor die 124, is designed to extend over a ground plane portion 316a such that the power plane, insulating layer 334, and ground plane 316a form the decoupling capacitor. Incorporating a decoupling capacitor into Fo-eWLB 310 reduces voltage fluctuation and increases the electrical performance of Fo-eWLB 310.

Interconnect units 312 facilitate electrical communication and signal routing between Fo-eWLB 310 and semiconductor die or components disposed over Fo-eWLB 310. Openings 333b expose signal pad portion 324b of conductive layer 324. Portion 324b is electrically connected to portion 320b of conductive layer 320 and portion 316b of conductive layer 316. Portions 324b, 320b, and 316b are designed to route signals between conductive layer 336 and semiconductor die or components disposed over Fo-eWLB 310. Interconnect units 312 also provide ground plane and power plane connection for semiconductor die or components electrically coupled to Fo-eWLB 310.

Interconnect units 312 are preformed units that can be mounted to a carrier, similar to carrier 260 in FIG. 7a, using a pick and place method. Interconnect units 312 are disposed over the carrier and adjacent to semiconductor die 124 prior to depositing encapsulant 328. Embedding preformed interconnect units 312 is faster, less expensive, and lower risk than forming additional RDLs, which require complex, highly controlled, expensive, and time-consuming manufacturing steps. Providing a ground and power planes and an additional conductive layer by embedding interconnect units 312 reduces manufacturing time, increases throughput, and decreases an overall cost of Fo-eWLB 310. Embedded interconnect units 312 increase the electrical performance and functionality of Fo-eWLB 310, without increasing package thickness.

Figure 10A:
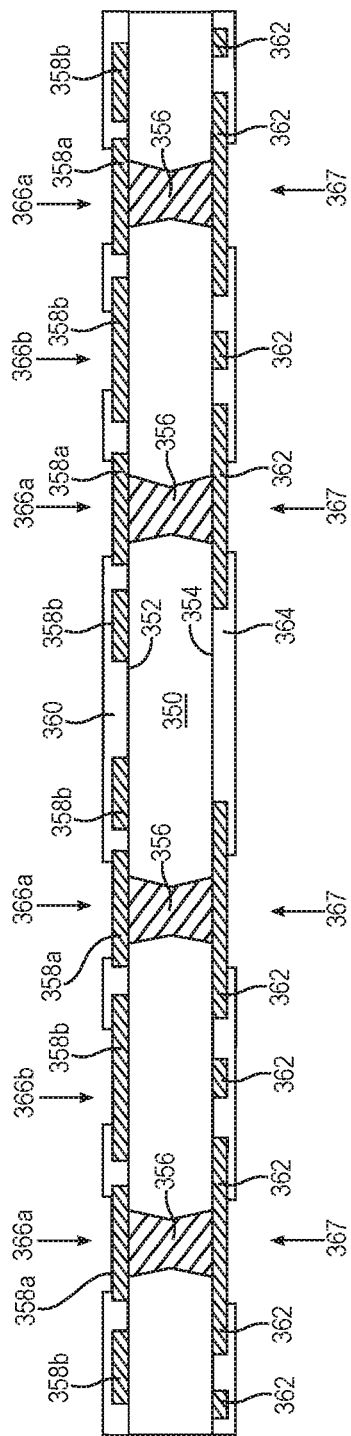
FIGS. 10a-10c illustrate a process of forming modular PCB units.
Figure 10C:
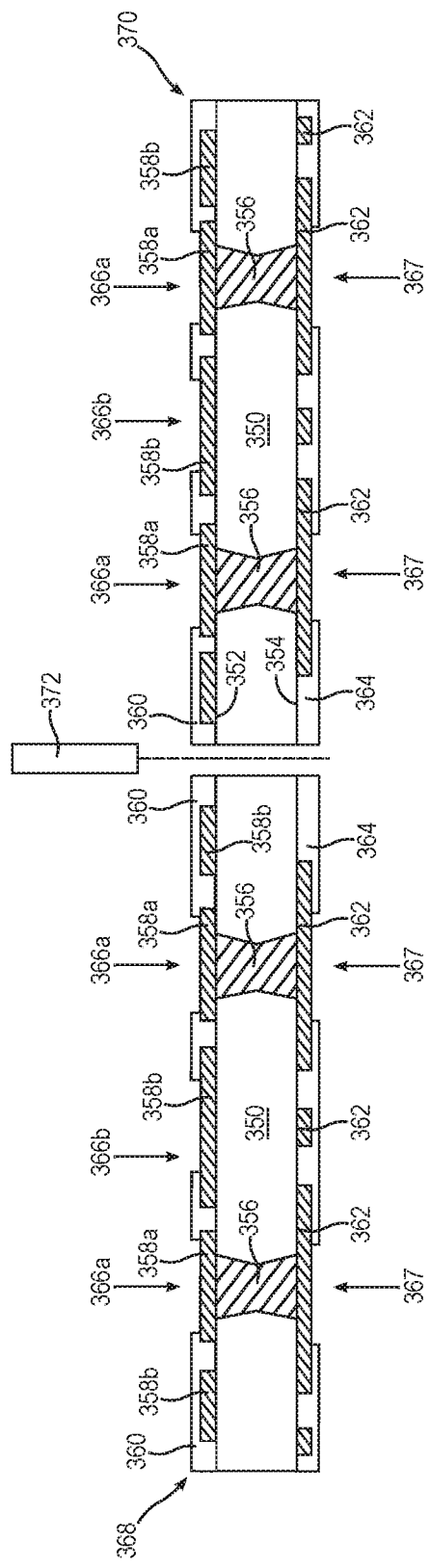
Figure 10B:
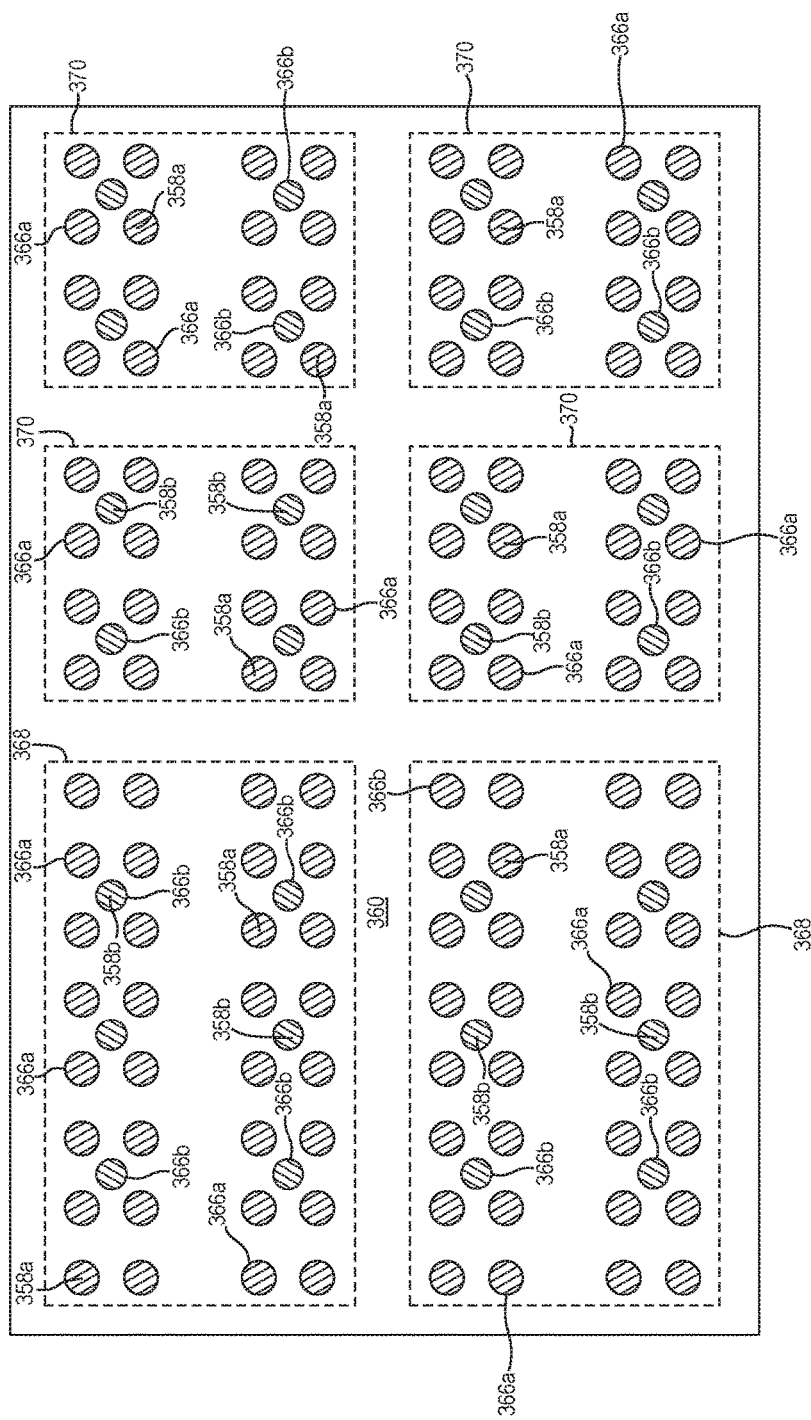

FIGS. 10a-10c illustrate a process of forming modular PCB units. FIG. 10a shows a cross-sectional view of a portion of a core substrate 350. Core substrate 350 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 350 includes one or more insulating or passivation layers. Core substrate 350 has opposing surfaces 352 and 354.

A plurality of through vias is formed through core substrate 350 using laser drilling, mechanical drilling, deep reactive ion etching (DRIE), or other suitable process. The through vias extend completely through core substrate 350 from surface 352 to surface 354. The through vias are filled with Al, Cu, Sn, Ni, Au, Ag, Ti, W, or other suitable electrically conductive material using PVD, CVD, electrolytic plating, electroless plating process, or other suitable metal deposition process to form z-direction vertical interconnect structures or conductive vias 356. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug.

A conductive layer 358 is formed over surface 352 of core substrate 350 and vertical interconnect structures 356 using PVD, CVD, electrolytic plating, electroless plating process, or other suitable metal deposition. Conductive layer 358 includes one or more layers of Al, Cu, Sn, Ni, Au, Ag, or other suitable electrically conductive material. Portions 358a of conductive layer 358 operate as contact pads and are electrically connected to vertical interconnect structures 356. Conductive layer 358 also includes portions 358b. Portions 358a and 358b may electrically common or electrically isolated depending the routing design and function of the semiconductor package.

An insulating or passivation layer 360 is formed over surface 352 of core substrate 350 and conductive layers 358a-358b using PVD, CVD, printing, spin coating, spray coating, slit coating, rolling coating, lamination, sintering, or thermal oxidation. Insulating layer 360 includes one or more layers of SiO2, Si3N4, SiON, Ta2O5, Al2O3, or other material having similar insulating and structural properties. In one embodiment, insulating layer 360 is a solder mask. A portion of insulating layer 360 is removed by LDA, etching, or other suitable process to form openings 366. Openings 366 expose conductive layer 358. Openings 366a expose portions 358a of conductive layer 358. Openings 366b expose portions 358b of conductive layer 358.

An electrically conductive layer 362 is formed over surface 354 of core substrate 350 using PVD, CVD, electrolytic plating, electroless plating process, or other suitable metal deposition. Conductive layer 362 includes one or more layers of Al, Cu, Sn, Ni, Au, Ag, or other suitable electrically conductive material. One portion of conductive layer 362 operates as contact pads electrically connected to vertical interconnect structures 356. Other portions of conductive layer 362 can be electrically common or electrically isolated depending on the design and function of the semiconductor package. Alternatively, vertical interconnect structures 356 are formed through core substrate 350 after forming conductive layer 358 and/or conductive layer 362.

An insulating or passivation layer 364 is formed over surface 354 of core substrate 350 and conductive layer 362 using PVD, CVD, printing, spin coating, spray coating, slit coating, rolling coating, lamination, sintering, or thermal oxidation. Insulating layer 364 includes one or more layers of SiO2, Si3N4, SiON, Ta2O5, Al2O3, or other material having similar insulating and structural properties. In one embodiment, insulating layer 364 is a solder mask. A portion of insulating layer 364 is removed by LDA, etching, or other suitable process to form openings 367 and expose conductive layer 362.

Core substrate 350 with vertical interconnect structures 356 and conductive layers 358 and 362 constitutes one or more PCB units. FIG. 10b shows a plan view of core substrate 350 organized into PCB units or bars 368 and 370. PCB units 368 and 370 contain multiple rows of vertical interconnect structures 356 extending between opposing surfaces of the PCB unit. PCB units 368 and 370 are configured for integration into stacked or package-on-package (PoP) semiconductor devices. PCB units 368 and 370 facilitate electrical interconnect between stacked semiconductor devices. PCB units 368 and 370 can differ in size depending on a final device configuration. While PCB units 368 and 370 are illustrated in FIG. 10b as including square or rectangular footprints, alternatively, PCB units 368 and 370 can include cross-shaped (+), angled or "L-shaped," circular, oval, hexagonal, octagonal, star shaped, or any geometrically shaped footprint. FIG. 10c shows core substrate 350 singulated into individual PCB units 368 and 370 using saw blade or laser cutting tool 372.

Figure 11A:
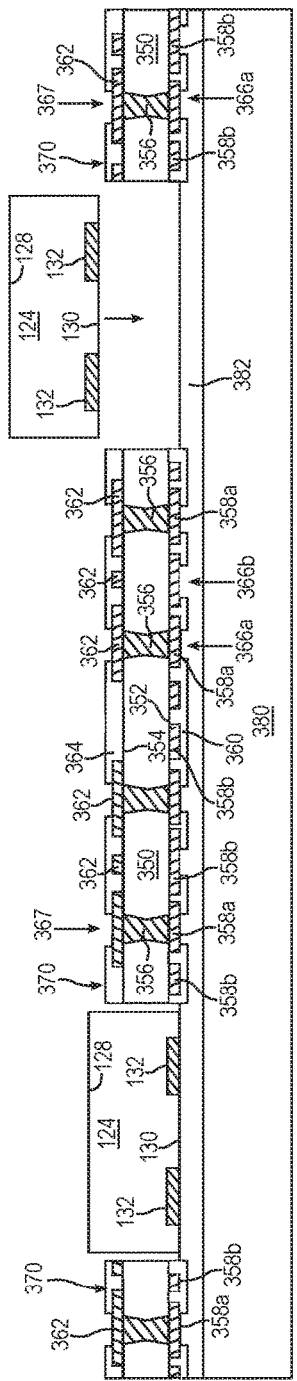
FIGS. 11a-11h illustrate a process embedding modular PCB units within a Fo-eWLB to provide vertical interconnection and an embedded conductive layer.

FIGS. 11a-11h illustrate, in relation to FIG. 1, a process of forming a Fo-eWLB including an embedded PCB unit. FIG. 11a shows a cross-sectional view of a portion of a carrier or temporary substrate 380 containing sacrificial base material such as silicon, polymer, beryllium oxide, glass, or other suitable low-cost, rigid material for structural support. In one embodiment, carrier 380 is a carrier tape. An interface layer or double-sided tape 382 is formed over carrier 380 as a temporary adhesive bonding film, etch-stop layer, or thermal release layer.

PCB units 368 and 370 from FIG. 10c are mounted to interface layer 382 and carrier 380 using a pick and place operation with conductive layers 358a-358b oriented toward carrier 380. In one embodiment, conductive layer 358 and/or conductive layer 362 include electrically isolated dummy portions. The dummy portions facilitate alignment of PCB units 368 and 370, and reduce overall pick and place time. The dummy portions also increase a planarization of insulating layers 360 and 364. The increased planarization improves adhesion of PCB units 368 and 370 on carrier 380 and interface layer 382. The dummy portions prevent the PCB units from shifting or flying on carrier 380. PCB units 368 and 370 may be pressed into interface layer 382 such that insulating layer 360 is disposed into the interface layer.

Figure 11B:
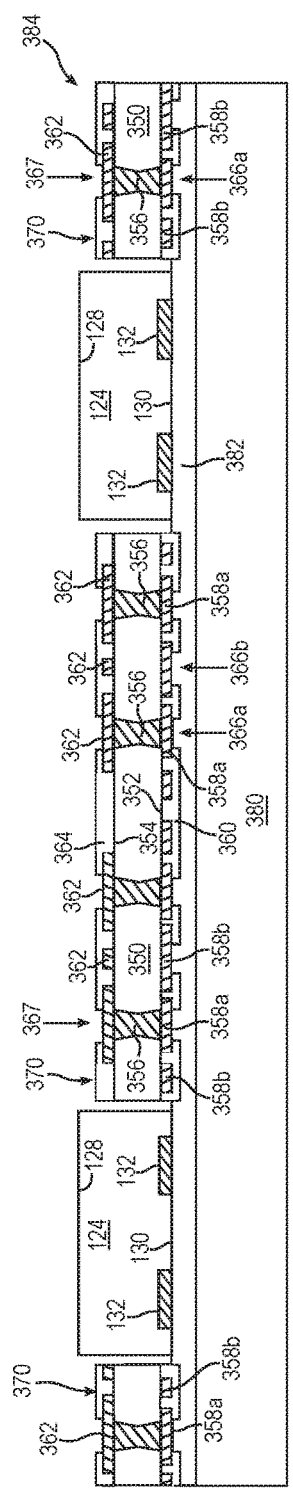

Semiconductor die 124 from FIG. 2d are mounted to interface layer 382 and carrier 380 using a pick and place operation with active surface 130 oriented toward the carrier. PCB units 368 and 370 are disposed in a peripheral region of semiconductor die 124. Alternatively, PCB units 368 and 370 are disposed over carrier 380 after mounting semiconductor die 124. FIG. 11b shows semiconductor die 124 and PCB units 368 and 370 disposed over carrier 380 as reconstituted or reconfigured wafer 384. In one embodiment, a ground plane layer, similar to conductive layer 236 in FIG. 5, is formed over surface 130 of semiconductor die 124.

Figure 11C:
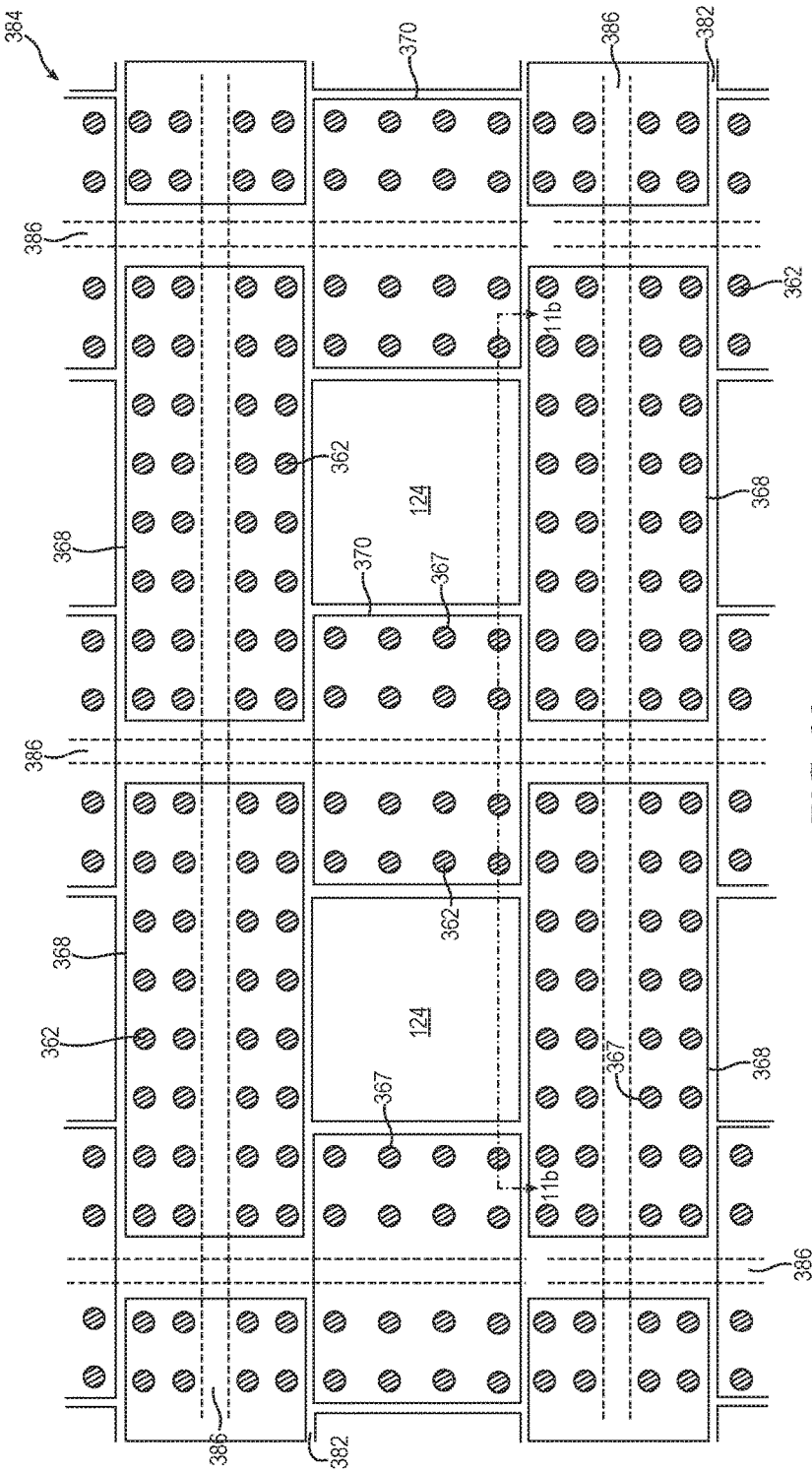

FIG. 11c shows a plan view of a portion of reconstituted wafer 384. PCB units 368 and 370 and semiconductor die 124 are mounted over interface layer 382. PCB units 368 and 370 are disposed around semiconductor die 124 in an interlocking pattern. Openings 367 expose multiple rows of contact pads 362. Contact pads 362 are electrically connected to vertical interconnect structures 356. Vertical interconnect structures 356 provide electrical interconnection between opposing surface 352 and 354 of PCB units 368 and 370. A plurality of saw streets 386 is aligned with respect to semiconductor die 124. Saw streets 368 extend across PCB units 368 and 370. When reconstituted wafer 384 is singulated along saw streets 386, each semiconductor die 124 has a plurality of vertical interconnect structures 356 and a plurality of conductive layers 358b disposed around or in a peripheral region of semiconductor die 124. While PCB units 368 and 370 are illustrated with interlocking square and rectangular footprints, the PCB units disposed around semiconductor die 124 can include PCB units having footprints with a cross-shape (+), an angled or "L-shape," a circular or oval shape, a hexagonal shape, an octagonal shape, a star shape, or any other geometric shape. Alternatively, PCB unit 368 and/or PCB unit 370 may be disposed adjacent to one, two, or three side surfaces of semiconductor die 124. In one embodiment, the PCB unit is a single unit or sheet and semiconductor die 124 are disposed in openings that are formed or punched through the PCB unit. Any number and/or configuration of PCB units may be disposed adjacent to semiconductor die 124 depending on the routing design and function of the semiconductor package.

Figure 11D:
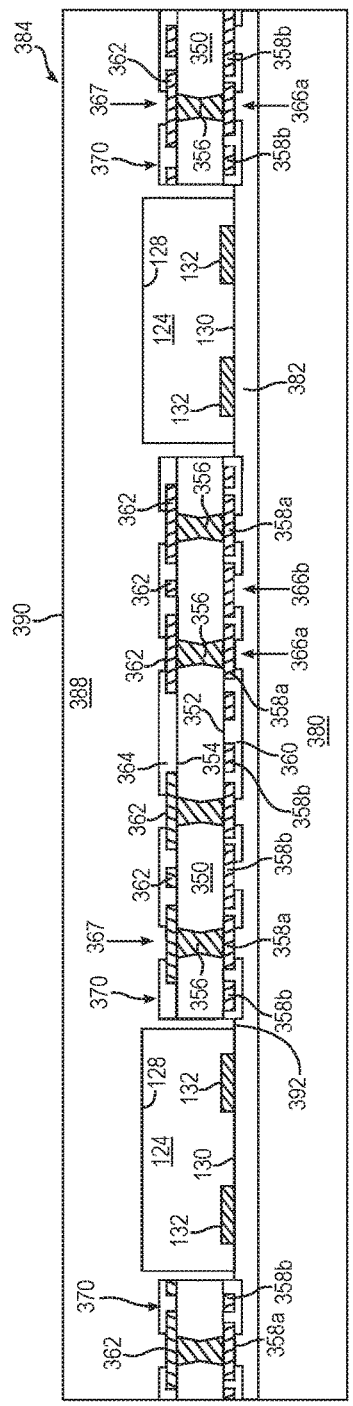

In FIG. 11d, an encapsulant or molding compound 388 is deposited over semiconductor die 124, PCB units 368 and 370, and carrier 380 using a paste printing, compressive molding, transfer molding, liquid encapsulant molding, vacuum lamination, spin coating, or other suitable applicator. Encapsulant 388 can be polymer composite material, such as epoxy resin with filler, epoxy acrylate with filler, or polymer with proper filler. Encapsulant 388 is non-conductive and environmentally protects the semiconductor device from external elements and contaminants. Encapsulant 388 also protects semiconductor die 124 from degradation due to exposure to light. Encapsulant 388 has opposing surfaces 390 and 392. Surface 392 of encapsulant 388 is substantially coplanar with active surface 130 of semiconductor die 124.

Figure 11E:
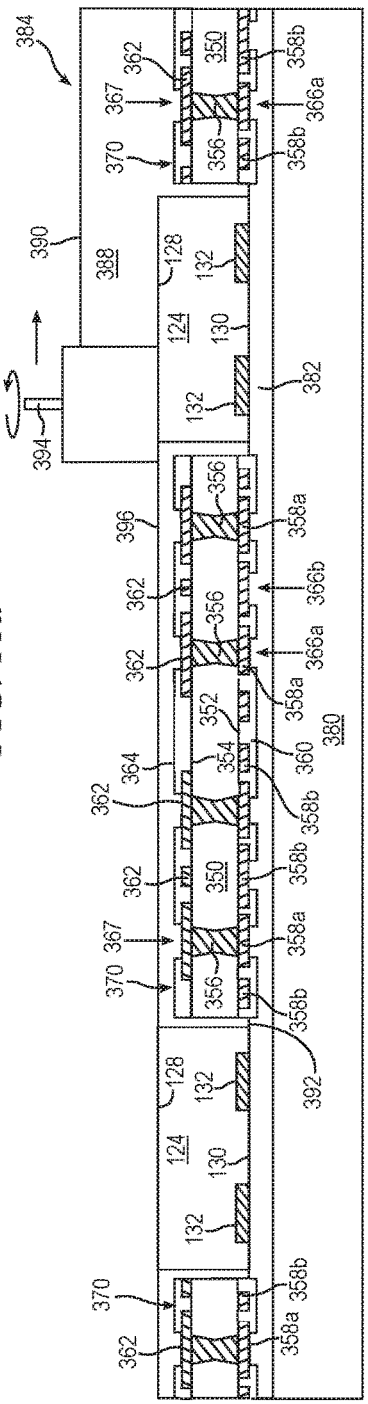

In FIG. 11e, a portion of encapsulant 388 is removed from surface 390 in a backgrinding operation using grinder 394. The backgrinding operation removes encapsulant 388 from over surface 128 of semiconductor die 124 and reduces a thickness of reconstituted wafer 384. Encapsulant 388 remains over PCB units 368 and 370. A surface 396 of encapsulant 388 is coplanar with surface 128 of semiconductor die 124. In one embodiment, a portion of semiconductor die 124 is removed from back surface 128 during the backgrinding operation to further thin reconstituted wafer 384.

Figure 11F:
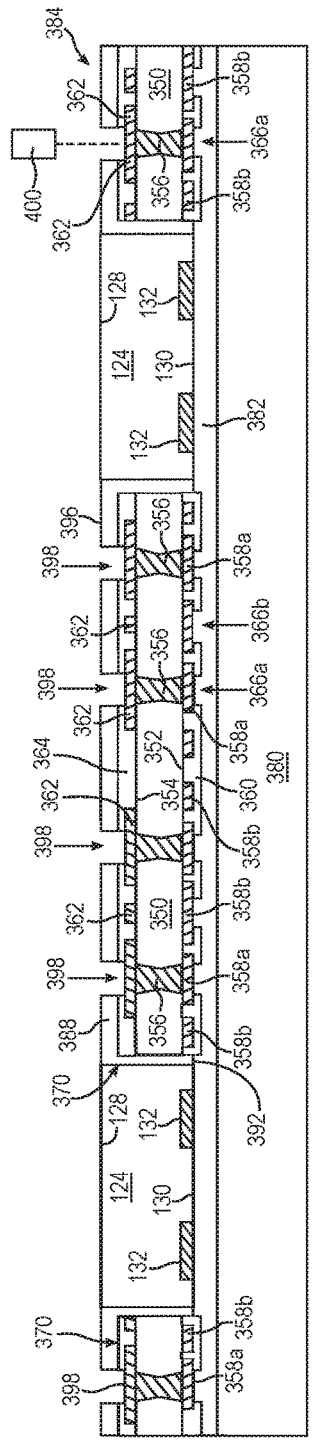

In FIG. 11f, a plurality of openings 398 is formed in surface 396 of encapsulant 388. Openings 398 include a vertical or sloped sidewall and extend from surface 396 of encapsulant 388 to contact pads 362 of vertical interconnect units 368 and 370. Openings 398 are formed by LDA using laser 400. Alternatively, openings 398 are formed by etching or other suitable process. Openings 398 are configured to provide 3D electrical interconnect between semiconductor die 124 and semiconductor die or devices, for example, memory devices, passive devices, saw filters, inductors, antenna, etc., stacked over semiconductor die 124. In one embodiment, a finish such as Cu organic solderability preservative (OSP) is applied to exposed conductive layer 362 to prevent Cu oxidation.

Figure 11G:
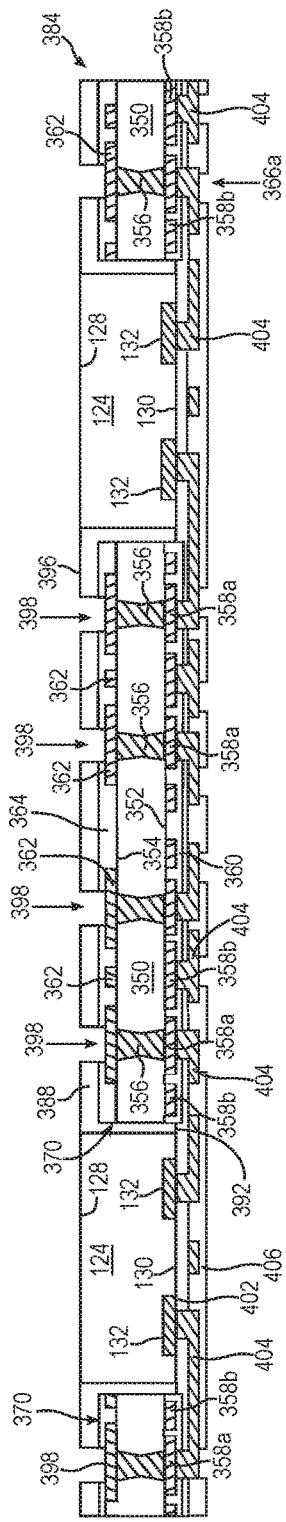

In FIG. 11g, carrier 380 and interface layer 382 are removed by chemical etching, mechanical peeling, CMP, mechanical grinding, thermal bake, UV light, laser scanning, or wet stripping. Removing carrier 380 and interface layer 382 exposes surface 392 of encapsulant 388, active surface 130 of semiconductor die 124, and insulating layer 360 and conductive layers 358a-358b of PCB units 368 and 370.

An insulating or passivation layer 402 is formed over surface 392 of encapsulant 388, active surface 130 of semiconductor die 124, and PCB units 368 and 370 using PVD, CVD, printing, lamination, spin coating, spray coating, sintering, or thermal oxidation. Insulating layer 402 contains one or more layers of SiO2, Si3N4, SiON, Ta2O5, Al2O3, or other material having similar insulating and structural properties. A portion of insulating layer 402 is removed by LDA, etching, or other suitable process to expose conductive layer 132 and conductive layers 358a-358b.

An electrically conductive layer or RDL 404 is formed over insulating layer 402 using a patterning and metal deposition process such as sputtering, electrolytic plating, or electroless plating. Conductive layer 404 can be one or more layers of Al, Cu, Sn, Ni, Au, Ag, or other suitable electrically conductive material. One portion of conductive layer 404 is electrically connected to conductive layer 132. One portion of conductive layer 404 is electrically connected to conductive layer 358b of PCB units 368 and 370. One portion of conductive layer 404 is electrically connected to conductive layer 358a of PCB units 368 and 370. Other portions of conductive layer 404 can be electrically common or electrically isolated depending on the design and function of semiconductor die 124. Conductive layer 404 provides signal routing and power and ground connections within the semiconductor package.

An insulating or passivation layer 406 is formed over insulating layer 402 and conductive layer 404 using PVD, CVD, printing, lamination, spin coating, spray coating, sintering, or thermal oxidation. Insulating layer 406 contains one or more layers of SiO2, Si3N4, SiON, Ta2O5, Al2O3, or other material having similar insulating and structural properties. In one embodiment, insulating layer 406 is a solder mask. A portion of insulating layer 406 is removed by LDA, etching, or other suitable process to expose conductive layer 404.

Figure 11H:
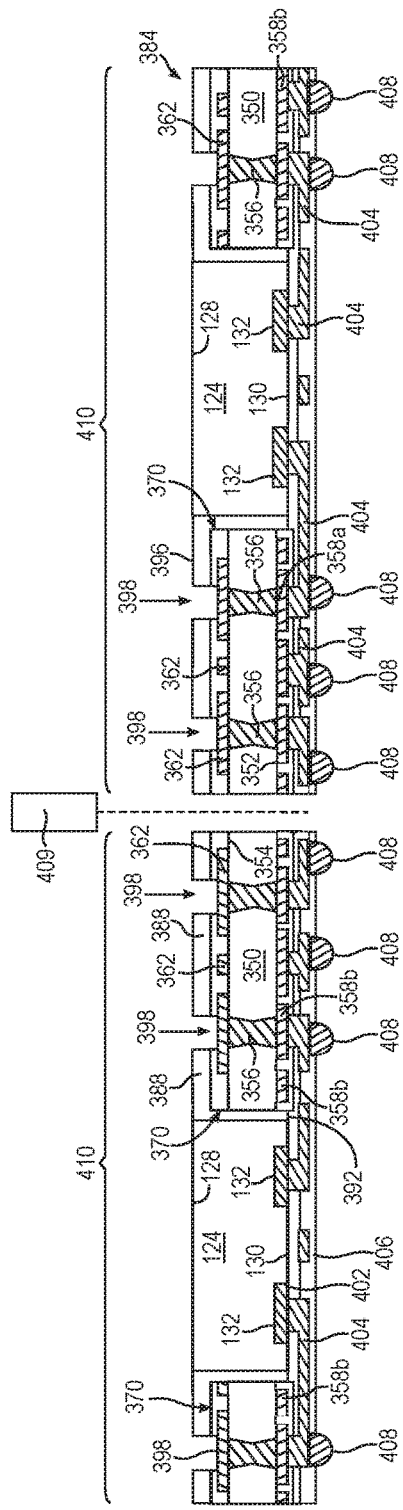

In FIG. 11h, an electrically conductive bump material is deposited over conductive layer 404 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 404 using a suitable attachment or bonding process. In one embodiment, the bump material is reflowed by heating the material above the material's melting point to form balls or bumps 408. In some applications, bumps 408 are reflowed a second time to improve electrical contact to conductive layer 404. In one embodiment, bumps 408 are formed over a UBM layer. Bumps 408 can also be compression bonded or thermocompression bonded to conductive layer 404. Bumps 408 represent one type of interconnect structure that can be formed over conductive layer 404. The interconnect structure can also use bond wires, conductive paste, stud bump, micro bump, or other electrical interconnect.

Conductive layers 358b of PCB units 368 and 370 are electrically connected through conductive layer 404 to bumps 408 for connection to an external $V_{SS}$ or $V_{DD}$. Each conductive layer 358b can be connected to $V_{SS}$ or to $V_{DD}$. $V_{SS}$ may be connected to any conductive layer 358b. $V_{DD}$ may be connected to any conductive layer 358b. The conductive layers 358b that are connected to $V_{SS}$ form a ground plane. The conductive layers 358b that are connected to $V_{DD}$ form a power plane. The ground planes 358b are electrically isolated from the power planes 358b.

The ground plane provided by PCB units 368 and 370 is disposed underneath insulating layer 402 and is electrically isolated from signal traces of conductive layer 404. Power traces of conductive layer 404 supply power to semiconductor die 124 by connecting the power plane. The power traces can be formed between semiconductor die 124 and any part of the power plane, i.e., any conductive layer 358b connected to $V_{DD}$. The location of PCB units 368 and 370, the location of the power plane, and the location of the power traces are selected to minimize trace length.

Figure 12:
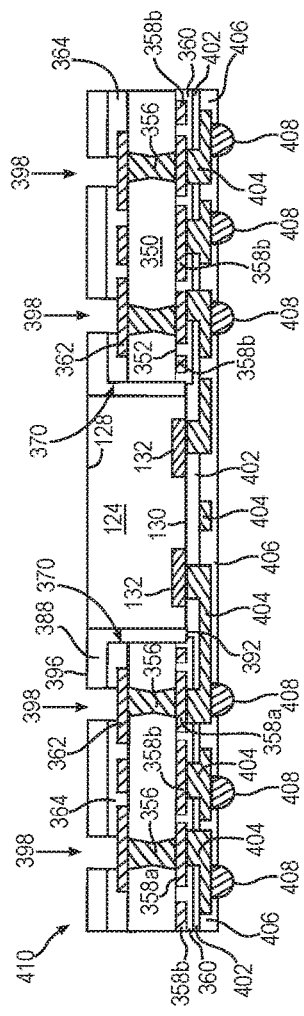
FIG. 12 illustrates a Fo-eWLB including an embedded PCB unit.

Reconstituted wafer 384 is singulated through encapsulant 388 and saw streets 386 of PCB units 368 and 370 using saw blade or laser cutting tool 409 into individual Fo-eWLB 410. FIG. 12 shows Fo-eWLB 410 after singulation. Semiconductor die 124 is electrically connected through conductive layer 404 to bumps 408 for connection to external devices, e.g., a PCB. PCB units 368 and 370 are embedded in encapsulant 388 in a peripheral region of semiconductor die 124. Semiconductor die 124 is electrically connected through conductive layer 404 to conductive layers 358a-358b of PCB units 368 and 370. Conductive layers 358b of PCB units 368 and 370 are electrically connected through conductive layer 404 to bumps 408 for connection to an external $V_{SS}$ or $V_{DD}$. Conductive layers 358b provide ground and power planes adjacent to semiconductor die 124. Embedded PCB units 368 and 370 form ground and power planes without requiring formation of additional RDLs over conductive layer 404. Forming less RDLs increases package reliability and decreases an overall thickness of Fo-eWLB 410.

Forming a power plane by disposing PCB units 368 and 370 adjacent to semiconductor die 124 increases flexibility in routing design. PCB units 368 and 370 can be disposed anywhere a power plane is needed and power traces of conductive layer 404 can connect to any portion of the power plane, i.e., conductive layer 358b connected to $V_{DD}$. The increased flexibility in routing design allows for the shortest possible traces length. Decreased trace length creates a more efficient PDN and increases the speed and functionality of Fo-eWLB 410.

The ground plane provided by conductive layers 358b is disposed underneath insulating layer 402 and is electrically isolated from signal traces of conductive layer 404. Disposing insulating layer 402 and signal traces of conductive layer 404 over the ground plane facilitates the formation of microstrip lines across Fo-eWLB 410. Microstrip lines convey microwave frequency signals and allow microwave components, e.g., antennas, couplers, filters, power dividers, etc., to be incorporated into Fo-eWLB 410. Forming a ground plane also increases ESD protection within Fo-eWLB 410.

Conductive layer 358b of PCB units 368 and 370 provides an additional conductive layer within Fo-eWLB 410. The additional conductive layer is used to form a decoupling capacitor. The decoupling capacitor is formed by designing a power network in conductive layer 404 over insulating layer 402 and a portion of conductive layers 358b. In one embodiment, the power network, i.e., portions of conductive layer 404 that supply power to semiconductor die 124, is designed to extend over a ground plane portion 358b such that the power network, insulating layer 402, and ground plane 358b form the decoupling capacitor. Incorporating a decoupling capacitor into Fo-eWLB 410 reduces voltage fluctuation and increases the electrical performance of Fo-eWLB 410.

PCB units 368 and 370 facilitate an electrical interconnection of semiconductor die or components mounted over Fo-eWLB 410. Openings 398 expose conductive layer 362 to provide signal, ground, and power interconnection for semiconductor die or components disposed over Fo-eWLB 410. PCB units 368 and 370 are modular, prefabricated units that can be incorporated into a variety of semiconductor packages. PCB units 368 and 370 are mounted to carrier 380 using a pick and place method. Forming an additional conductive layer and power and ground planes using prefabricated PCB units 368 and 370 is faster, less expensive, and lower risk than forming additional RDLs, which require complex, highly controlled, expensive, and time-consuming manufacturing steps. Embedding PCB units 368 and 370 reduces manufacturing time, increases throughput, and decreases an overall cost of Fo-eWLB 410. Embedded PCB units 368 and 370 increase the electrical performance and functionality of Fo-eWLB 410, without increasing package thickness.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a semiconductor die;
a ground plane disposed outside a footprint of the semiconductor die, wherein the semiconductor die includes a first side oriented toward the ground plane and a second side opposite the first side oriented away from the ground plane, and wherein the ground plane includes a thickness between a first surface and a second surface of the ground plane that is less than a width of the ground plane in a direction perpendicular to the thickness;
an encapsulant deposited over the semiconductor die and the ground plane, wherein a surface of the encapsulant is coplanar to the first surface of the ground plane and a first surface of the semiconductor die, and wherein the encapsulant completely covers the second surface of the ground plane and a second surface of the semiconductor die opposite the first surface of the semiconductor die;
an insulating layer formed directly on the surface of the encapsulant, the first surface of the semiconductor die, and the first surface of the ground plane;
a conductive layer formed directly on a surface of the insulating layer, wherein the conductive layer includes,
a first conductive trace electrically coupling the semiconductor die to the ground plane, and
a second conductive trace extending from the semiconductor die and over the ground plane without physically contacting the ground plane; and
a solder bump disposed directly on the conductive layer.

2. The semiconductor device of claim 1, further including an interconnect structure embedded within the encapsulant with the ground plane formed over a surface of the interconnect structure.

3. The semiconductor device of claim 2, wherein the interconnect structure includes a plurality of conductive vias.

4. The semiconductor device of claim 1, wherein the ground plane is disposed on a dummy die outside the footprint of the semiconductor die.

5. The semiconductor device of claim 1, further including a power plane formed as part of the conductive layer, wherein the ground plane and power plane form a decoupling capacitor.

6. The semiconductor device of claim 1, further including an interconnect structure formed over the conductive layer, wherein the second conductive trace extends to the interconnect structure and the interconnect structure is disposed over the ground plane.

7. The semiconductor device of claim 1, wherein the first conductive trace extends completely from the semiconductor die to the ground plane.

8. A semiconductor device, comprising:
a semiconductor die comprising an active surface and a back surface opposite the active surface;
a conductive plane disposed outside a footprint of the semiconductor die, wherein the semiconductor die includes a first side surface oriented toward the conductive plane and a second side surface oriented away from the conductive plane, and wherein the first side surface and second side surface are perpendicular to the active surface of the semiconductor die;
an encapsulant deposited over the semiconductor die and the conductive plane, wherein a surface of the encapsulant is coplanar to the active surface of the semiconductor die and a front surface of the conductive plane, and wherein the encapsulant completely covers the back surface of the semiconductor die and a back surface of the conductive plane opposite the front surface of the conductive plane;
a first conductive trace formed over the semiconductor die and the conductive plane, wherein the first conductive trace is electrically isolated from the conductive plane; and
a second conductive trace electrically extending from the front surface of the conductive plane to a ground terminal or a voltage terminal.

9. The semiconductor device of claim 8, further including a power plane disposed outside a footprint of the semiconductor die, wherein the conductive plane includes a ground plane, and wherein a surface of the power plane is coplanar with a surface of the conductive plane and the active surface of the semiconductor die.

10. The semiconductor device of claim 8, wherein the conductive plane is disposed on an interconnect structure.

11. The semiconductor device of claim 10, wherein the interconnect structure includes a substrate and a plurality of conductive vias formed through the substrate.

12. The semiconductor device of claim 8, wherein the conductive plane is disposed on a dummy die within a height of the semiconductor die.

13. The semiconductor device of claim 8, further including a conductive bump formed directly on a surface of the conductive plane, wherein the surface of the conductive plane is coplanar with the active surface of the semiconductor die.

14. A semiconductor device, comprising:
a semiconductor die;
a flat conductive plane disposed adjacent to the semiconductor die, wherein the semiconductor die includes a first side oriented toward the flat conductive plane and a second side oriented away from the flat conductive plane;
an encapsulant deposited over the semiconductor die and the flat conductive plane, wherein a surface of the encapsulant is coplanar to a surface of the semiconductor die and a surface of the flat conductive plane;
a first conductive trace formed over the surface of the encapsulant, the surface of the semiconductor die, and the surface of the flat conductive plane and electrically coupling the flat conductive plane to the semiconductor die; and
a second conductive trace extending over the flat conductive plane without physically contacting the flat conductive plane.

15. The semiconductor device of claim 14, wherein the flat conductive plane is disposed on an interconnect structure and the encapsulant is deposited over the flat conductive plane and interconnect structure.

16. The semiconductor device of claim 15, wherein the interconnect structure includes a substrate and a plurality of conductive vias formed through the substrate.

17. The semiconductor device of claim 14, wherein the flat conductive plane is disposed on a dummy die and the encapsulant is deposited over the flat conductive plane and the dummy die.

18. The semiconductor device of claim 14, further including an interconnect structure formed over the first conductive trace opposite the flat conductive plane.

19. The semiconductor device of claim 14, wherein the second conductive trace forms a microstrip line.

20. A semiconductor device, comprising:
a semiconductor die including an active surface;
a flat conductive plane disposed adjacent to the semiconductor die, wherein a surface of the flat conductive plane is coplanar with the active surface of the semiconductor die, and wherein the semiconductor die includes a first side oriented toward the flat conductive plane and a second side oriented away from the flat conductive plane; and
a conductive layer formed directly over the flat conductive plane and directly over the active surface of the semiconductor die, wherein the conductive layer includes,
a first conductive trace electrically coupling the semiconductor die to the flat conductive plane, and
a second conductive trace extending from the semiconductor die and over the flat conductive plane without physically contacting the flat conductive plane.

21. The semiconductor device of claim 20, wherein the flat conductive plane is disposed on an interconnect structure.

22. The semiconductor device of claim 21, wherein the interconnect structure includes a substrate and a plurality of conductive vias formed through the substrate with one of the conductive vias electrically connected to the flat conductive plane.

23. The semiconductor device of claim 20, wherein the flat conductive plane is disposed on a dummy die.

24. The semiconductor device of claim 20, further including an encapsulant deposited over the semiconductor die and the flat conductive plane.

25. The semiconductor device of claim 20, wherein the flat conductive plane is disposed outside a footprint of the semiconductor die.

* * * * *